(12) United States Patent
Kim

(10) Patent No.: US 7,385,253 B2
(45) Date of Patent: Jun. 10, 2008

(54) DEVICE FOR ELECTROSTATIC DISCHARGE PROTECTION AND CIRCUIT THEREOF

(75) Inventor: Kil Ho Kim, Cheongju-si (KR)

(73) Assignee: Magnachip Semiconductor, Ltd., Chungcheongbuk-do (KR)

( * ) Notice: Subject to any disclaimer, the term of this patent is extended or adjusted under 35 U.S.C. 154(b) by 204 days.

(21) Appl. No.: 11/051,858

(22) Filed: Feb. 4, 2005

(65) Prior Publication Data

US 2005/0173765 A1 Aug. 11, 2005

(30) Foreign Application Priority Data

Feb. 6, 2004 (KR) .................. 10-2004-0008030

(51) Int. Cl.
*H01L 23/62* (2006.01)
(52) U.S. Cl. ....................... 257/356; 257/357
(58) Field of Classification Search ............... 257/356, 257/357, 371, 335
See application file for complete search history.

(56) References Cited

U.S. PATENT DOCUMENTS 6,498,357 B2 * 12/2002 Ker et al. ................ 257/173
6,803,626 B2 * 10/2004 Sapp et al. ................ 257/329
6,949,802 B2 * 9/2005 Shih et al. ................ 257/401

FOREIGN PATENT DOCUMENTS

JP 06-232393 * 8/1994

* cited by examiner

*Primary Examiner*—Howard Weiss
(74) *Attorney, Agent, or Firm*—Marshall, Gerstein & Borun LLP

(57) ABSTRACT

Disclosed herein are a device for electrostatic protection and circuit thereof. According to the present invention, a device for electrostatic discharge protection comprises first to third wells formed on a semiconductor substrate, a first device, which includes a well pick-up region, a source region and a double diffused drain region, which are formed in predetermined regions on the first well, and a gate formed in a predetermined region on the semiconductor substrate, a second device, which includes a source region, a double diffused drain region and a first active region, which are formed in predetermined regions on the second well, and a gate formed in a predetermined region on the semiconductor substrate, and a second active region formed on the third well, wherein the gate, the source region and the well pick-up region of the first device are connected to a ground pad; the drain of the first device, and the source and the gate of the second device are connected to a power source pad; and the drain and the first active region of the second device, and the second active region are connecter to an I/O pad. Therefore, a single ESD protection device can cope with ESD stress of six modes, which can occur in each of I/O cells. Accordingly, a layout area necessary for ESD protection can be reduced.

6 Claims, 29 Drawing Sheets

DEVICE FOR ELECTROSTATIC DISCHARGE PROTECTION AND CIRCUIT THEREOF

BACKGROUND

1. Field of the Invention

The present invention relates to a device for electrostatic discharge (hereinafter, referred to as "ESD") protection and circuit thereof, and more specifically, to a device for ESD protection and circuit thereof in which one ESD device can cope with the whole ESD stress of various modes, which can occur in respective I/O cells (or input cells and output cells), thereby reducing a layout area.

2. Discussion of Related Art

A conventional method of constructing an ESD protection circuit in which an ESD protection device is used in each of I/O cells (or input cell, output cell) is shown in FIGS. 1a and 1b.

FIG. 1a shows the configuration of a common ESD protection circuit for I/O cells (or input cells and output cells). FIG. 1b shows the configuration of a plurality of I/O cells, input cells and output cells.

An electrode constituting the respective I/O cells (or input cells and output cell) is composed of a power source pad 11, a ground pad 12, and an I/O pad 13. Furthermore, an input pad 14, which is composed of a first PMOS transistor P11 and a first NMOS transistor N11, is connected between the power source pad 11 and the ground pad 12. The gate of each of the first PMOS transistor P11 and the first NMOS transistor N11 is connected to the I/O pad 13. Also, an output pad 15, which is composed of a second PMOS transistor P12 and a second NMOS transistor N12, is connected between the power source pad 11 and the ground pad 12. The drain of each of the second PMOS transistor P12 and the second NMOS transistor N12 is connected to the I/O pad 13. In this configuration, ESD stress current can flow randomly between two electrodes of three electrodes. Therefore, the ESD stress type, which can occur in all electrode combinations of individual I/O cells, can be classified into the following six modes.

(1) Ground pad positive, power source pad floating, I/O pad ground (2) Ground pad: ground, power source pad: floating, I/O pad positive (3) Ground pad: floating, power source pad ground, I/O pad positive (4) Ground pad: floating, power source pad: positive, I/O pad ground (5) Ground pad: positive, power source pad: ground, I/O pad floating (6) Ground pad: ground, power source pad: positive, I/O pad floating In addition, there is pin-to-pin mode ESD stress in which ESD stress is added between the I/O cells and the I/O cell. Accordingly, an ideal ESD protection circuit can protect against all the six ESD stress modes and the pin-to-pin mode ESD stress. The most common ESD protection circuit has the configuration in which three individual ESD protection devices are disposed for each of electrode combinations, as shown in FIG. 1a.

A first ESD protection device 16 for protecting ESD of the power source pad 11 and the I/O pad 13 is connected between the power source pad 11 and the I/O pad 13. A second ESD protection device 17 for protecting ESD of the ground pad 12 and the I/O pad 13 is connected between the ground pad 12 and the I/O pad 13. A third ESD protection device 18 for protecting ESD of the power source pad 11 and the ground pad 12 is connected between the power source pad 111 and the ground pad 12.

This kind of the mode is advantageous in that it can implement relatively stable ESD protection for the entire I/O cells, but is disadvantageous in that two ESD protection devices have to be separately disposed in one I/O cell. Moreover, there is a problem in that lots of a layout area is taken because an ESD protection device such as a power clamp must be disposed between the power source pad and the ground pad. Furthermore, if the power clamp is not properly disposed between the power source pad and the ground pad, there is a possibility that problems can be generated in a core circuit because ESD stress applied between the two pads is introduced into the core circuit.

Accordingly, the conditions that an ESD protection device and an ESD protection structure, which need to be developed in order to solve the problems of the existing ESD protection structure, are as follows.

(1) It is required that one ESD protection device can protect the six ESD stress modes, which can occur in the respective I/O cells. More particularly, it is required that one ESD protection device cope with ESD protection between the power source pad and the ground pad even without the power clamp.

(2) It is required that the current immunity level of an ESD protection device corresponding to the six ESD stress modes be sufficiently high.

(3) It is required that the output buffer and the input buffer of the I/O cells be efficiently protected against the six ESD stress mode. To this end, a triggering voltage of the ESD protection device has to be similar to a BJT triggering voltage of a PMOS transistor and an NMOS transistor of each output buffer in a corresponding ESD stress mode. It is also required that an ESD stress voltage be lowered lower than the breakdown voltage of a gate oxide film.

(4) Additionally, it is required that a core circuit, an output buffer and an input buffer be protected against the pin-to-pin mode ESD stress in which ESD stress is added between the I/O cells and the I/O cell.

SUMMARY OF THE INVENTION

Accordingly, the present invention has been made in view of the above problems, and it is an object of the present invention to provide a device for ESD protection and circuit thereof in which one ESD device can cope with the whole ESD stress of various modes, which can occur in respective I/O cells (or input cells and output cells), thereby reducing a layout area.

Another object of the present invention is to provide a device for ESD protection and circuit thereof in which an output buffer and an input buffer of an I/O cells can be efficiently protected against ESD stress modes.

Still another object of the present invention is to provide a device for ESD protection and circuit thereof in which a core circuit, an output buffer and an input buffer can be efficiently protected against even pin-to-pin mode ESD stress.

To achieve the above object, according to the present invention, there is provided a device for electrostatic discharge protection, comprising: first to third wells formed on a semiconductor substrate, a first device, which includes a well pick-up region, a source region and a double diffused drain region, which are formed in predetermined regions on the first well, and a gate formed in a predetermined region on the semiconductor substrate, a second device, which includes a source region, a double diffused drain region and a first active region, which are formed in predetermined regions on the second well, and a gate formed in a predetermined region on the semiconductor substrate, and a second active region formed on the third well, wherein the gate, the source region and the well pick-up region of the first device are connected to a ground pad; the drain of the first device, and the source and the gate of the second device are connected to a power source pad; and the drain and the first active region of the second device, and the second active region are connecter to an I/O pad.

The first device comprises a plurality of element isolation films formed in predetermined regions on the semiconductor substrate, a gate formed in a predetermined region on the semiconductor substrate in which the first well is formed, a well pick-up region formed on the first well between the element isolation film and the element isolation film, a source active region formed on the first well between the element isolation film and the gate, a drain drift region formed to overlap with the first well and the second well between the gate and the element isolation film, and a drain active region formed in a predetermined region within the drain drift region.

The second device comprises a plurality of element isolation films formed in predetermined regions on the semiconductor substrate, a gate formed in a predetermined region on the semiconductor substrate in which the second well is formed, a source active region formed on the second well between the element isolation film and the gate, a drain drift region formed in the second well between the gate and the element isolation film, a drain active region formed in a predetermined region within the drain drift region, and a first active region formed in a predetermined region within the drain drift region.

Meanwhile, according to an embodiment of the present invention, there is provided a circuit for electrostatic discharge protection, comprising: an input buffer, which is connected between a power source pad and a ground pad and has one terminal connected to an I/O pad, and a device for electrostatic discharge protection, which is connected between the power source pad, the ground pad and the I/O pad.

According to another embodiment of the present invention, there is provided a circuit for electrostatic discharge protection, comprising: an output buffer, which is connected between a power source pad and a ground pad and has one terminal connected to an I/O pad, and a device for electrostatic discharge protection, which is connected between the power source pad, the ground pad and the I/O pad.

According to still another embodiment of the present invention, there is provided a circuit for electrostatic discharge protection, comprising: an input buffer, which is connected between a power source pad and a ground pad and has one terminal connected to an I/O pad, an output buffer, which is connected between a power source pad and a ground pad and has one terminal connected to an I/O pad, and a device for electrostatic discharge protection, which is connected between the power source pad, the ground pad and the I/O pad.

DETAILED DESCRIPTION OF PREFERRED EMBODIMENTS

Now, the preferred embodiments according to the present invention will be described with reference to the accompanying drawings.

Figure 1A:
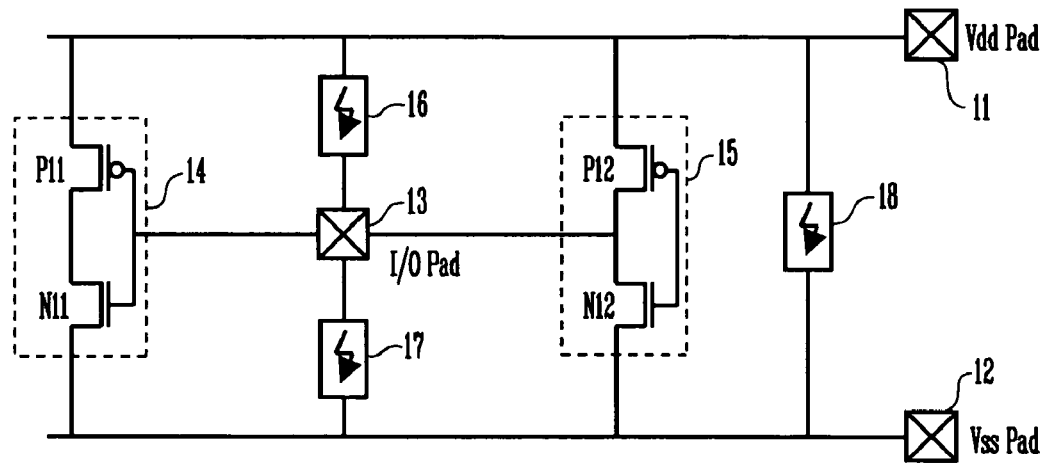
FIGS. 1a and 1b are circuit diagrams showing the configuration of a common ESD protection circuit.
Figure 1B:
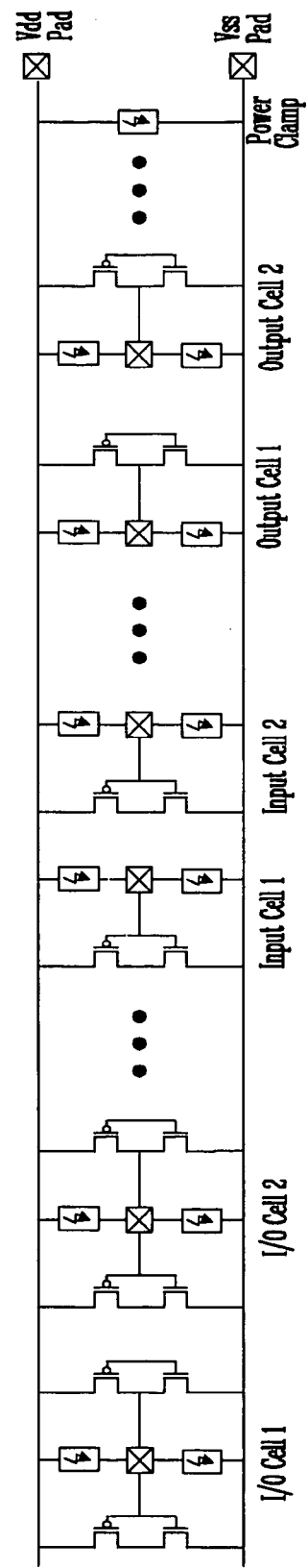
Figure 2A:
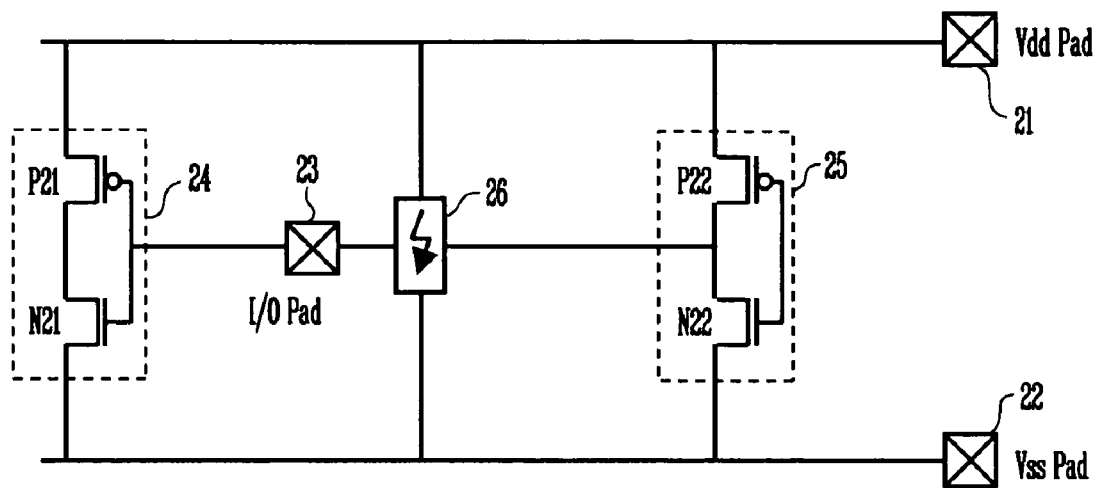
FIGS. 2a and 2b are circuit diagrams showing the configuration of an ESD protection circuit according to the present invention.
Figure 2B:
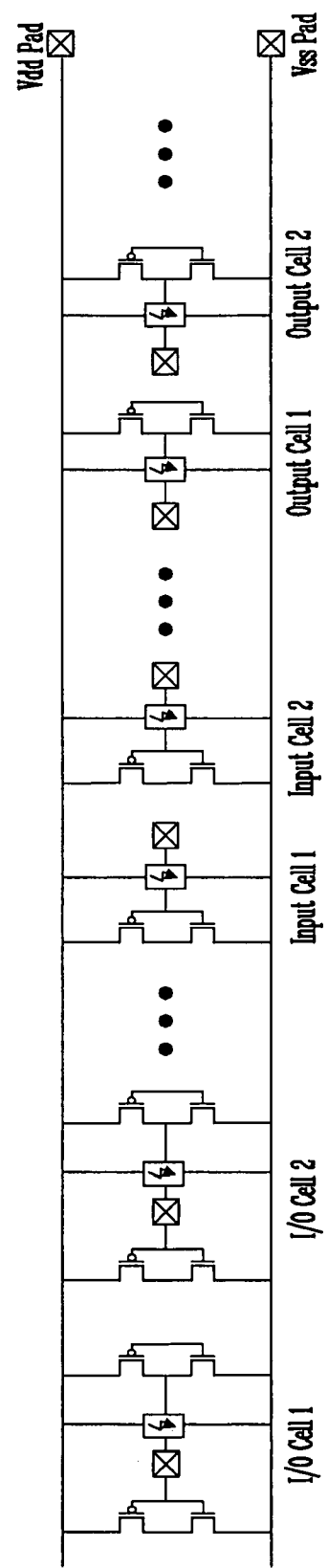

FIG. 2a shows the configuration of an ESD protection circuit for I/O cells (or input cells and output cells) according to the present invention. FIG. 2b shows the configuration of an ESD protection circuit for a plurality of I/O cells, input cells and output cells.

Referring to FIG. 2a, an input pad 24, which is composed of a first PMOS transistor P21 and a first NMOS transistor N21, is connected between a power source pad 21 and a ground pad 22. The first PMOS transistor P21 and the first NMOS transistor N21 have their gate connected to an I/O pad 23. Also, an output pad 25, which is composed of a second PMOS transistor P22 and a second NMOS transistor N22, is connected between the power source pad 21 and the ground pad 22. The second PMOS transistor P22 and the second NMOS transistor N22 have their drain connected to the I/O pad 23. Furthermore, an ESD protection device 26 for protecting ESD of the power source pad 21, the ground pad 22 and the I/O pad 23 are connected to an intersection of the power source pad 21, the ground pad 22 and the I/O pad 23.

The ESD protection device constructed above according to the present invention adopts a mode in which a single ESD protection device copes with the whole ESD stress of the six modes, which can occur in each of the I/O cells (or input cells and output cells). If this mode is adopted, only one ESD protection device can be disposed in each of the I/O cells and a power clamp needs not to be disposed between the power source pad and the ground pad. It is thus possible to reduce a layout area compared to an existing mode. As a result, since the power clamp between the power source pad and the ground pad is uniformly disposed in each of the I/O cells, a possibility that ESD stress applied between the two pads is introduced into the core circuit due to the problem in arrangement of the power clamp, thus resulting in a problem, can be prevented fundamentally.

Figure 3A:
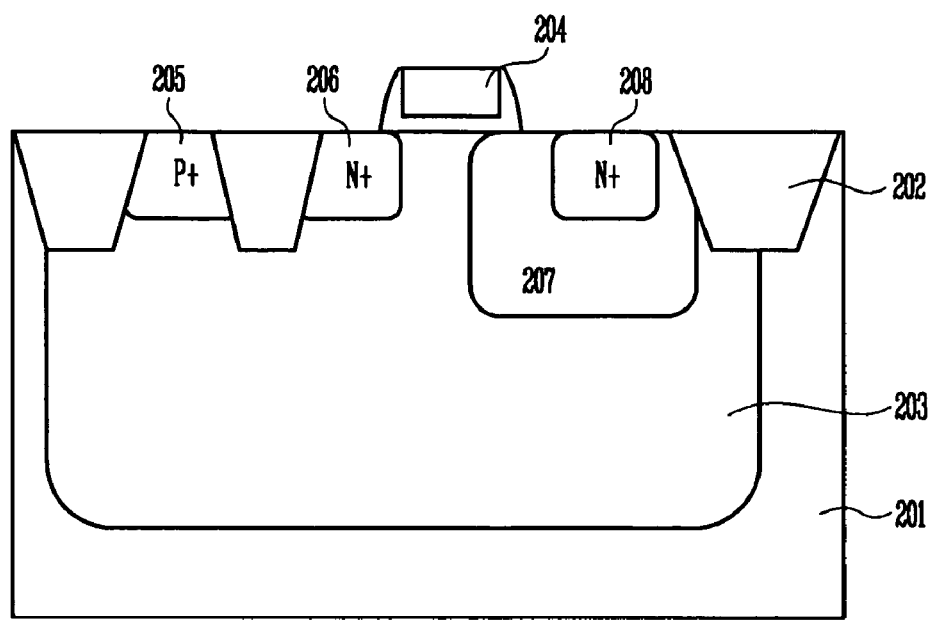
FIGS. 3a and 3b are cross-sectional view showing the DDD MOSFETs that operate at high voltage.
Figure 3B:
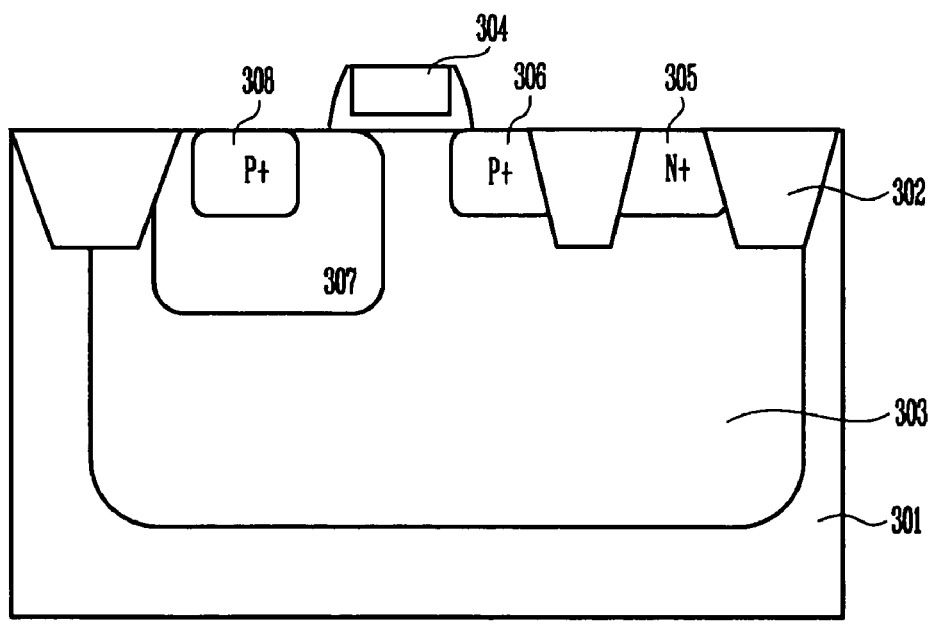

A basic structure of a transistor that operates at high voltage is shown in FIGS. 3a and 3b. One of the basic characteristics of a semiconductor device, which operates at high voltage, is that a junction breakdown voltage must be higher than the operating voltage. In order to meet this characteristic, a transistor that adopts the drain into which an impurity is doubly diffused, so-called a double diffused drain (hereinafter, referred to as "DDD") transistor is used. FIGS. 3a and 3b are cross-sectional views of a DDDNMOS transistor and a DDDPMOS transistor, which operate at high voltage.

Referring to FIG. 3a, a plurality of element isolation films 202 is formed in a predetermined region on a P-type semiconductor substrate 201. A well 203 is formed in the semiconductor substrate 201 by means of an impurity ion implant process. A gate 204 is then formed in a predetermined region on the semiconductor substrate 201. A well pick-up region 205 is formed in a predetermined region between the element isolation films 202 by means of a P-type impurity ion implant process. A source active region 206 is formed on the semiconductor substrate 201 between the element isolation film 202 and the gate 204 by means of an N-type impurity ion implant process. Furthermore, a drain drift region 207 is formed on the semiconductor substrate 201 between the gate 204 and the element isolation film 202 by means of low-concentration N-type impurity ion implant. A drain active region 208 is formed within the drain drift region 207 by means of high concentration N-type impurity ion implant.

Referring to FIG. 3b, a plurality of element isolation films 302 is formed in a predetermined region on a P-type semiconductor substrate 301. A well 303 is formed in the semiconductor substrate 301 by means of an impurity ion implant process. A gate 304 is then formed in a predetermined region on the semiconductor substrate 301. A well pick-up region 305 is formed in a predetermined region between the element isolation films 302 by means of an N-type impurity ion implant process. A source active region 306 is formed on the semiconductor substrate 301 between the element isolation film 302 and the gate 304 by means of a P-type impurity ion implant process. Furthermore, a drain drift region 307 is formed on the semiconductor substrate 301 between the gate 304 and the element isolation film 302 by means of low-concentration P-type impurity ion implant. A drain active region 308 is formed within the drain drift region 307 by means of high-concentration P-type impurity ion implant.

In the above, in order to form the DDD transistor structure, the ion implant process for forming the drain is carried out in dual, wherein the drain active regions 208 and 308 are formed by implanting an impurity of a sufficient high concentration, e.g., $10^{15}$ to $10^{16}$ cm$^{-3}$ and the drain drift regions 207 and 307 are formed by implanting an impurity of a relatively low concentration, e.g., $10^{13}$ cm$^{-3}$. In most cases, since the source active regions 206 and 306 undergo the ion implant process simultaneously with the drain active regions 208 and 308, the impurity concentration of the source active regions 206 and 306 is the same as that of the drain active regions 208 and 308. The wells 203 and 303 forming a channel are formed by implanting an impurity of a concentration, which is lower than that of the drain drift regions 207 and 307, e.g., $10^{12}$ cm$^{-3}$. The junction breakdown voltage is determined by the impurity concentration of two regions having an electrically opposite polarity, which come in contact with each other. Accordingly, the junction breakdown voltage of the DDDNMOS transistor is determined by the concentration of an impurity, which is implanted into the drain drift region 207 and the well 203, and the junction breakdown voltage of the DDDPMOS transistor is determined by the concentration of an impurity, which is implanted into the drain drift region 307 and the well 303. Generally, there is a tendency that the lower the impurity concentration of two regions having an electrically opposite polarity, which come in contact with each other, the higher the junction breakdown voltage. Therefore, if the DDD structure is adopted, a junction breakdown voltage as high as a desired degree can be implemented because the impurity concentration of the drain drift regions 207 and 307, which come in contact with the wells 203 and 303, can be sufficiently lowered.

Figure 4:
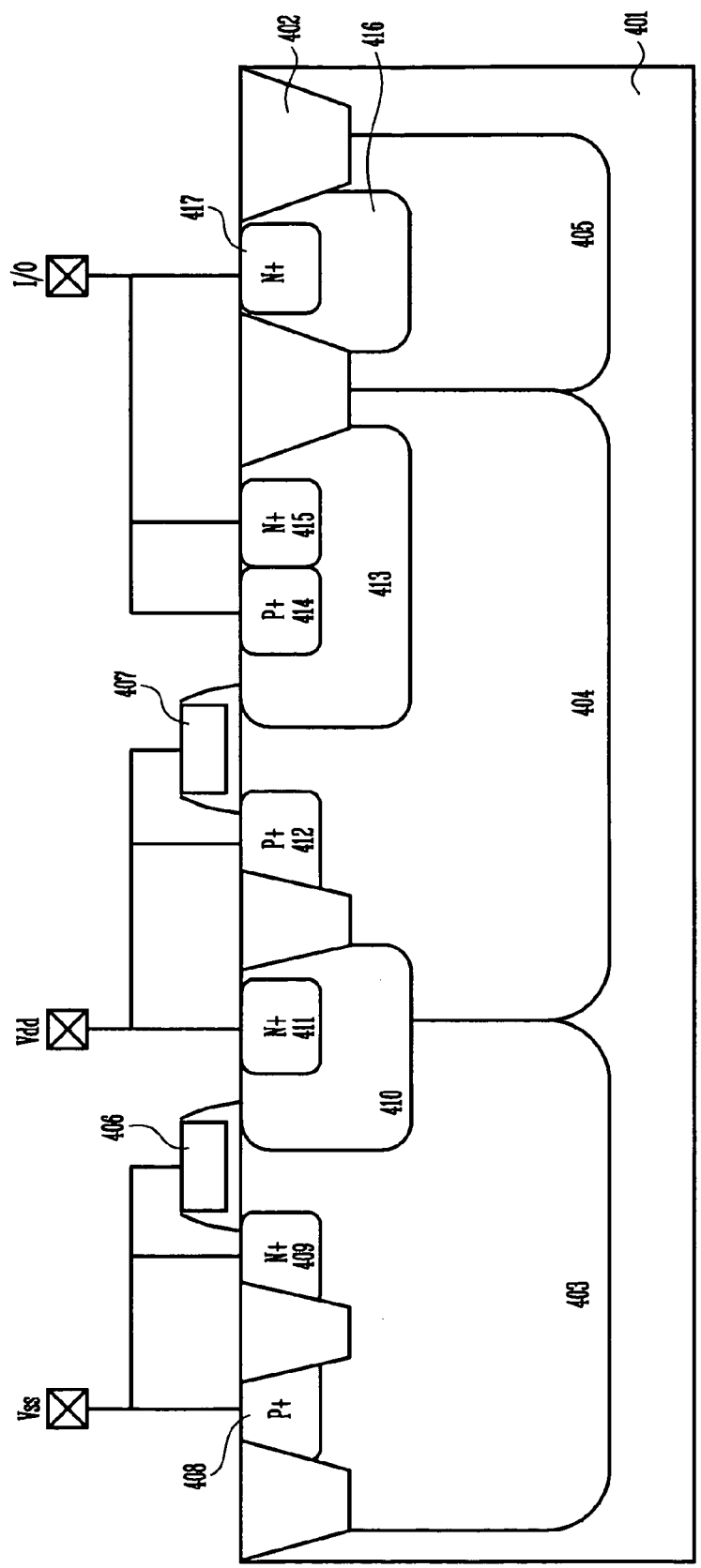
FIG. 4 is a cross-sectional view of a multi-mode ESD device that operates at high voltage according to the present invention.

A single ESD protection device which can cope with the whole ESD stress of the six modes, which can occur in the respective I/O cells (or input cells and output cells), by using this the DDDMOS transistor, i.e., a multi-mode ESD device that operates at high voltage is shown in FIG. 4.

Referring to FIG. 4, element isolation films 402 are formed in predetermined regions of a semiconductor substrate 401 to define an NMOS transistor region and a PMOS transistor region, and a given structural region, which will be formed in each of these regions. A P-type impurity ion implant process is performed to form a first well 403 in the NMOS transistor region, and an N-type impurity ion implant process is performed to form a second well 404 in the PMOS transistor region. A P-type impurity ion implant process is then carried out to form an additional third well 405. In this time, the first well 403 and the third well 405 can be formed by the same process, and the second well 404 is formed to partially overlap with the NMOS transistor region.

Gate 406 and 407 are formed in predetermined regions on the semiconductor substrate 401 in the NMOS transistor region and the PMOS transistor region. A P-type impurity ion implant process is performed to form a well pick-up region 408 between the element isolation films 402 in the NMOS transistor region. An N-type impurity ion implant process is then performed to form a source active region 409 between the element isolation films 402 and the gate 406 in the NMOS transistor region. An N-type low-concentration impurity ion implant process is carried out to form a drain drift region 410 between the gate 406 and the element isolation films 402 in the NMOS transistor region. An N-type high-concentration impurity ion implant process is performed to form a drain active region 411 within the drain drift region 410 of the NMOS transistor region. In this time, since the second well 404 of the PMOS transistor region is formed to partially overlap with the NMOS transistor region, the drain drift region 410 is formed over the first well 403 and the second well 404.

A P-type impurity ion implant process is performed to form a source active region 412 between the element isolation films 402 and the gate 407 of the PMOS transistor region. A P-type low-concentration impurity ion implant process is performed to form a drain drift region 413 between the gate 407 and the element isolation films 402 of the PMOS transistor region. A P-type high-concentration impurity ion implant process is performed to form a drain active region 414 within the drain drift region 413 of the PMOS transistor region. Furthermore, an N-type high-concentration impurity ion implant process is performed to form a first active region 415 within the drain drift region 413 of the PMOS transistor region so that the first active region 415 does not overlap with the drain active region 414.

An N-type low-concentration impurity ion implant process is then performed to form a drift region 416 within the third well 405. An N-type high-concentration impurity ion implant process is then performed to form a second active region 417 within the drift region 416.

In the multi-mode ESD protection device constructed above according to the present invention, the gate 406, the source active region 409 and the well pick-up region 408 of the DDDNMOS transistor are connected to the ground pad Vss. The drain active region 411 of the DDDPMOS transistor, and the source active region 412 and the gate 407 of the DDDNMOS transistor are connected to the power source pad Vdd. Furthermore, the drain active region 414, the first active region 415 and the second active region 417 of the DDDPMOS transistor are connected to the I/O pad I/O.

The multi-mode ESD protection device constructed above, which operates at high voltage, can implement protection against ESD stress of the six modes, which can occur in the respective I/O cells. More particularly, a high junction breakdown voltage can be implemented by forming the multi-mode ESD protection device by using the DDD transistor. Thus, the multi-mode ESD protection device can be applied to ESD protection device of I/O cells, which operate at high voltage. The principle that the device proposed in the present invention operates against the six ESD stress modes will now be described with reference to FIGS. 5a to 5f.

Figure 5A:
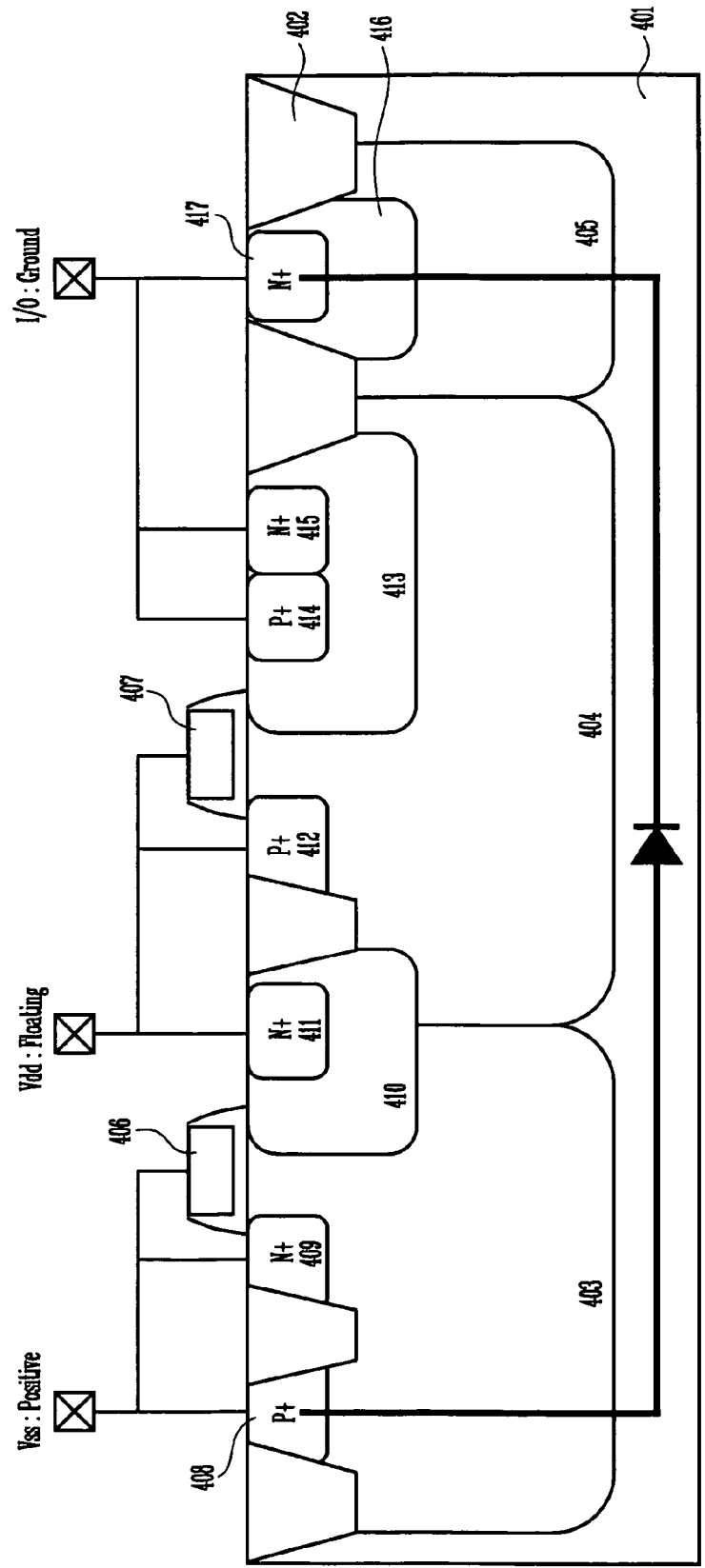
FIGS. 5a to 5f are cross-sectional views for explaining the operational principle of the multi-mode ESD device that operates at high voltage according to the present invention.

Referring to FIG. 5a, when in the polarity of an ESD stress mode, the ground pad Vss is a positive voltage, the power source pad Vdd is in a floating state, and the I/O pad is I/O is in a ground state, a forward biased diode between the ground pad Vss and the I/O pad I/O, i.e., between the first well 401 and the second active region 417 operates to cope with ESD stress. Generally, what the ground pad Vss keeps a higher voltage than the I/O pad I/O is considered as an abnormal operating state, i.e., a noise signal or a state where ESD stress is added. Meanwhile, since the operating voltage of the forward biased diode between the first well 401 and the second active region 417 is very low, i.e., 0.6 to 1.0V, it is possible to cope with all the abnormal operating states where the ground pad Vss keeps a higher voltage than the I/O pad I/O in a very efficient manner.

Figure 5B:
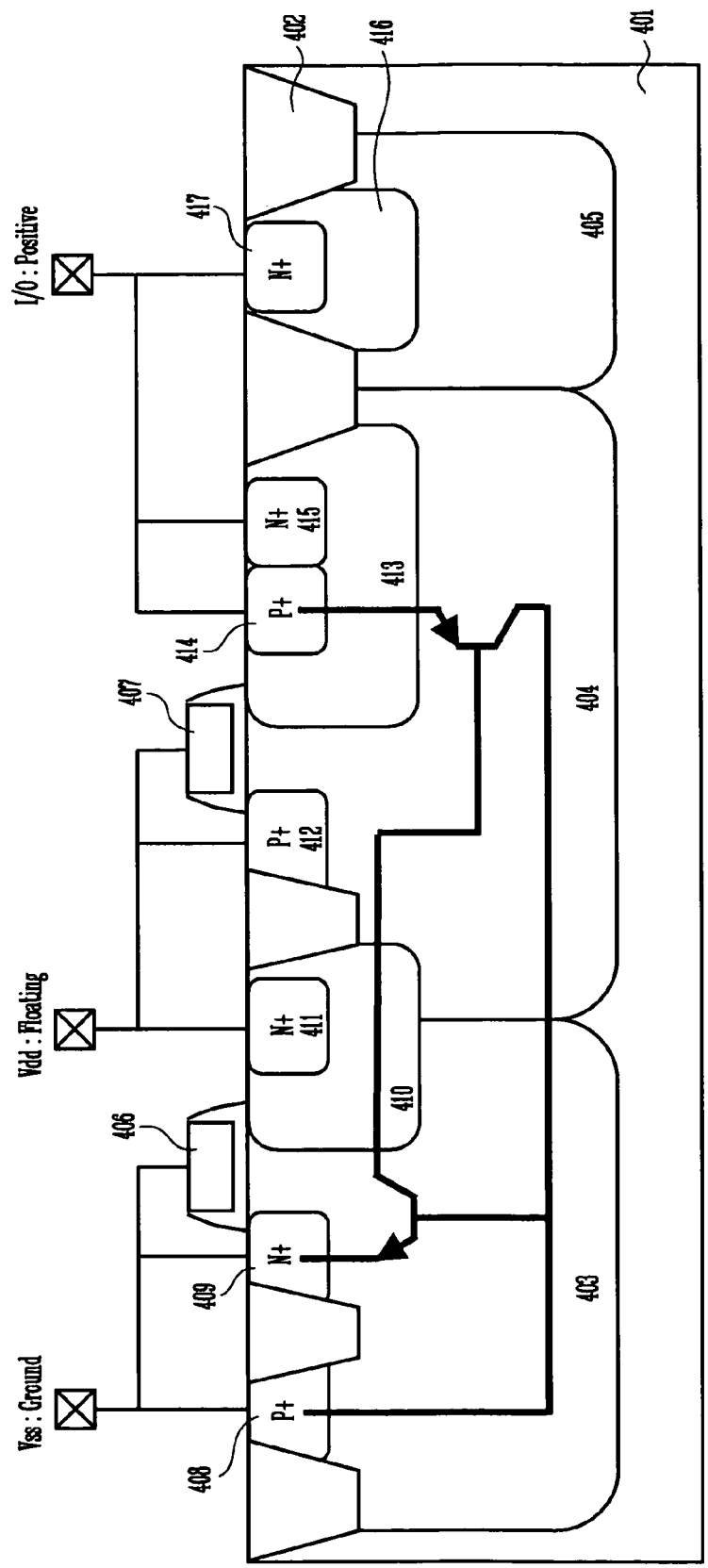

Referring to FIG. 5b, when in the polarity of an ESD stress mode, the ground pad Vss is in a ground state, the power source pad Vdd is in a floating state and the I/O pad I/O is a positive voltage, a SCR in which a lateral NPN BJT and a vertical PNP BJT are interconnected between the I/O pad I/O and the ground pad Vss operates to cope with ESD stress. In this time, an avalanche breakdown voltage of the lateral NPN BJT is determined by a lateral breakdown voltage of the drain drift region 410 and the first well 403. Furthermore, an avalanche breakdown voltage of the vertical PNP BJT is determined by a vertical breakdown voltage of the drain drift region 413 and the second well 404. However, if the ion implant process of the drift region and the ion implant process of the well are properly controlled, the lateral breakdown voltage of the drain drift region 410 and the first well 403 can be made lower than the vertical breakdown voltage of the drain drift region 413 and the second well 404. Meanwhile, the lateral breakdown voltage of the drain drift region 410 and the first well 403 is the same as the avalanche breakdown voltage of the NMOS transistor output driver. Accordingly, a triggering voltage of the ESD protection device, which operates when in the polarity of an ESD stress mode, the ground pad Vss is in a ground state, the power source pad Vdd is in a floating state and the I/O pad I/O is a positive voltage, can be made similar to the BJT triggering voltage of the NMOS transistor output driver, which is the lowest. It is thus possible to effectively protect the NMOS transistor output driver.

Figure 5C:
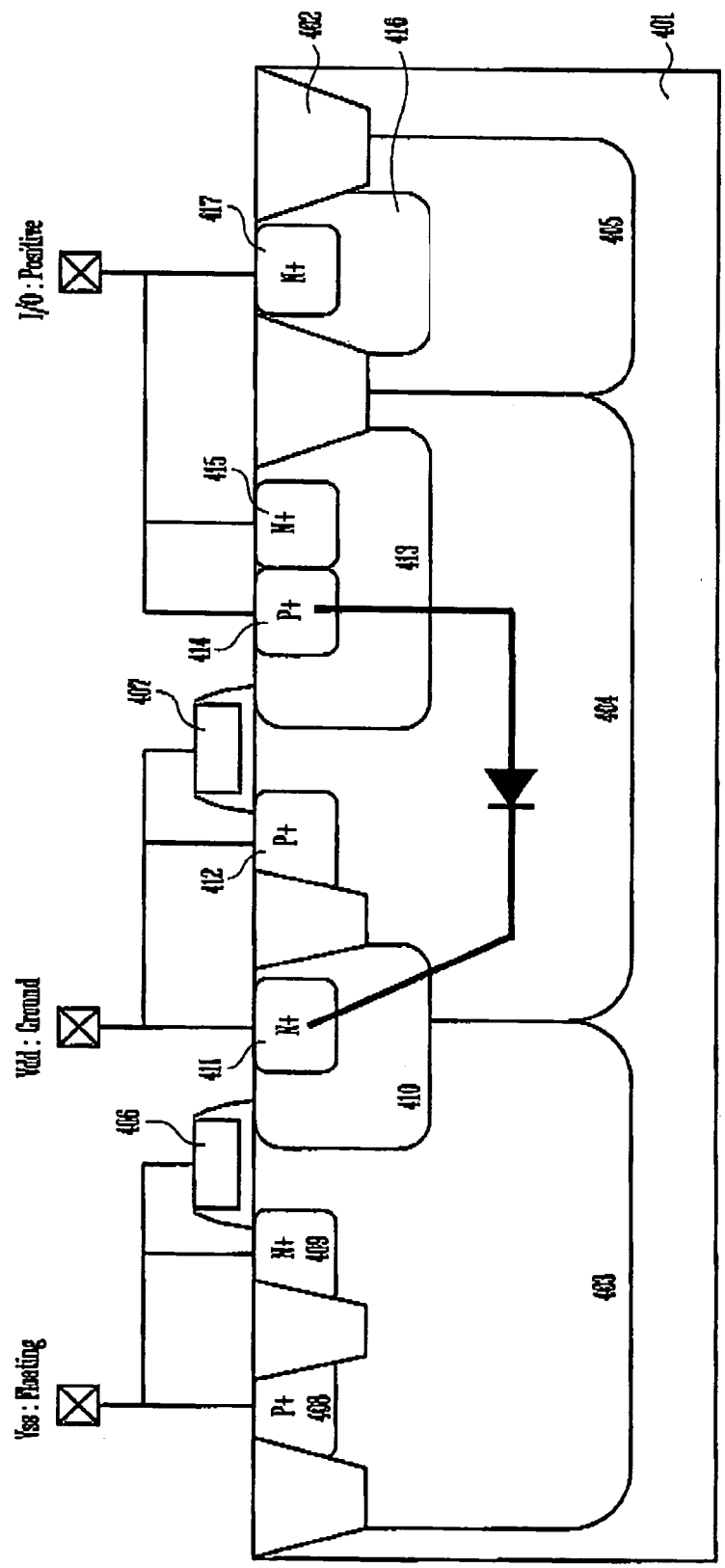

Referring to FIG. 5c, when in the polarity of an ESD stress mode, the ground pad Vss is in a floating state, the power source pad Vdd is in a ground state and the I/O pad I/O is a positive voltage, a forward biased diode between the I/O pad I/O and the power source pad Vdd, i.e., between the drain active region 414 and the second well 404 operates to cope with the ESD stress. Generally, what the I/O pad I/O keeps a higher voltage than ?¹the power source pad Vdd is considered as an abnormal operating state, i.e., a noise signal or a state where ESD stress is added. Meanwhile, since the operating voltage of the forward biased diode is very low, i.e., 0.6 to 1.0V, it is possible to cope with all abnormal operating states where the I/O pad I/O keeps a higher voltage than the power source pad Vdd in a very efficient manner.

Figure 5D:
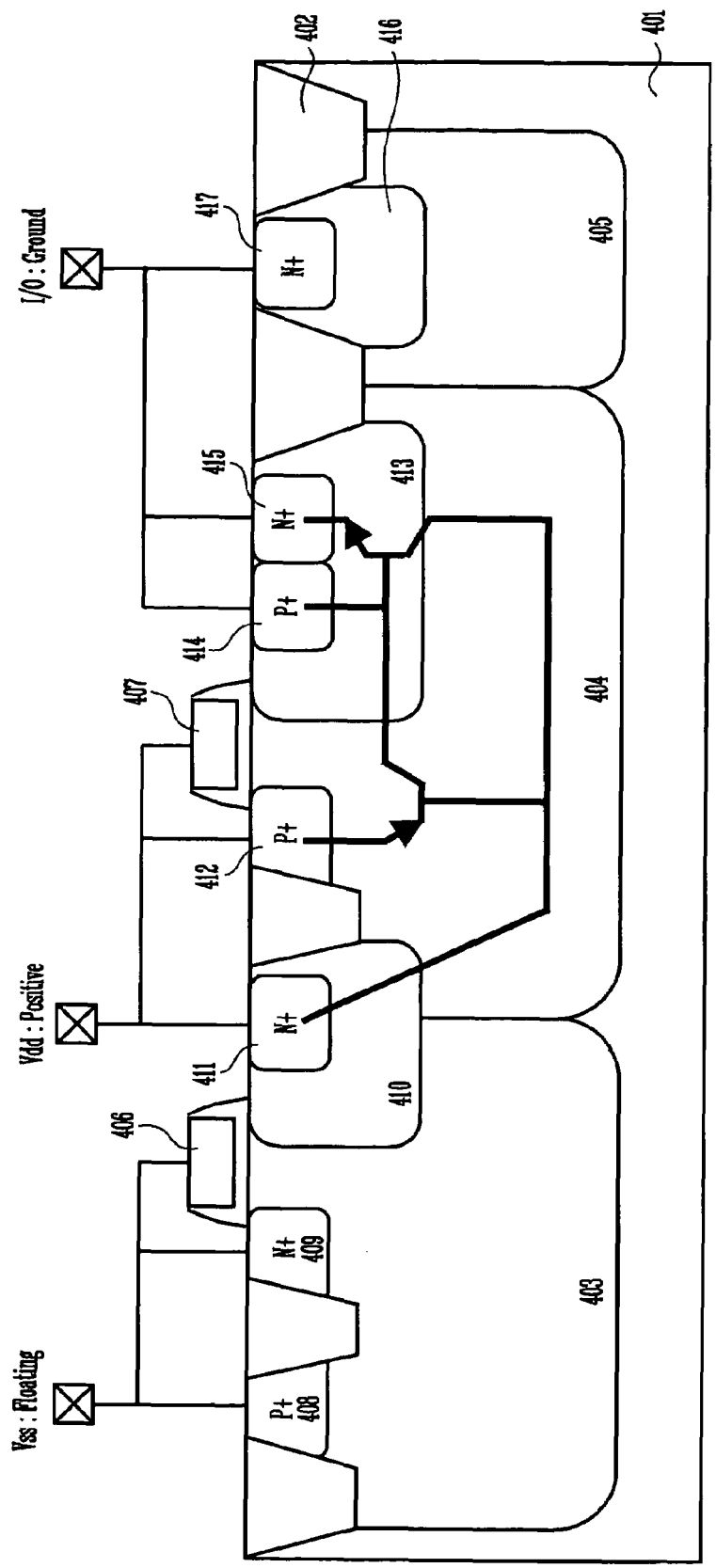

Referring to FIG. 5d, when in the polarity of an ESD stress mode, the ground pad Vss is in a floating state, the power source pad Vdd is a positive voltage and the I/O pad I/O is in a ground state, a SCR in which a lateral PNP BJT and a vertical NPN BJT are interconnected between the power source pad Vdd and the I/O pad I/O operates to cope with the ESD stress. In this time, an avalanche breakdown voltage of the lateral PNP BJT is determined by a lateral breakdown voltage of the drain drift region 413 and the second well 404. Also, the avalanche breakdown voltage of the vertical NPN BJT is determined by the lateral breakdown voltage of the drain drift region 413 and the second well 404. However, the lateral breakdown voltage of the drain drift region 413 and the second well 404 is lower than a vertical breakdown voltage of the drain drift region 413 and the second well 404. Meanwhile, the lateral breakdown voltage of the drain drift region 413 and the second well 404 is the same as the avalanche breakdown voltage of a PMOS transistor output driver. Accordingly, a triggering voltage of an ESD protection device, which operates when the polarity of ESD stress, the ground pad Vss is in a floating state, the power source pad Vdd is a positive voltage and the I/O pad I/O is in a ground state, can be made the same as a BJT triggering voltage of a PMOS transistor output driver, which is the lowest under ESD stress of the same polarity. Thus, the PMOS transistor output driver can be protected effectively.

Figure 5E:
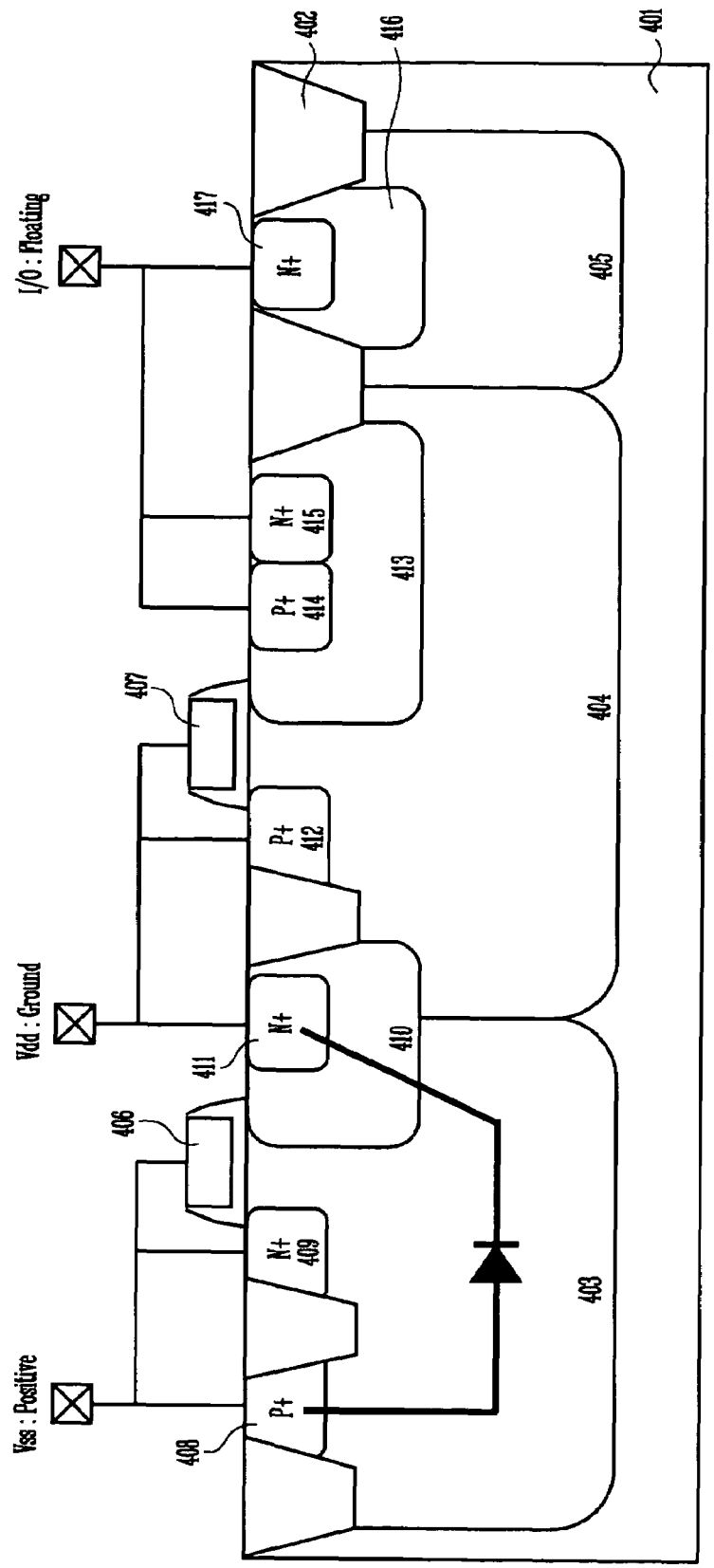

Referring to FIG. 5e, when in the polarity of an ESD stress mode, the ground pad Vss is a positive voltage, the power source pad Vdd is in a ground state and the I/O pad I/O is in a floating state, a forward biased diode between the ground pad Vss and the power source pad Vdd, i.e., between the first well 401 and the drain active region 411 operates to cope with the ESD stress. Generally, what the ground pad Vss keeps a higher voltage than the power source pad Vdd is considered as an abnormal operating state, i.e., a noise signal or a state where ESD stress is added. Meanwhile, since the operating voltage of the forward biased diode between the first well 401 and the drain active region 411 is very low, i.e., 0.6 to 1.0V, it is possible to cope with all the abnormal operating states where the ground pad Vss keeps a higher voltage than the power source pad Vdd in a very efficient manner.

Figure 5F:
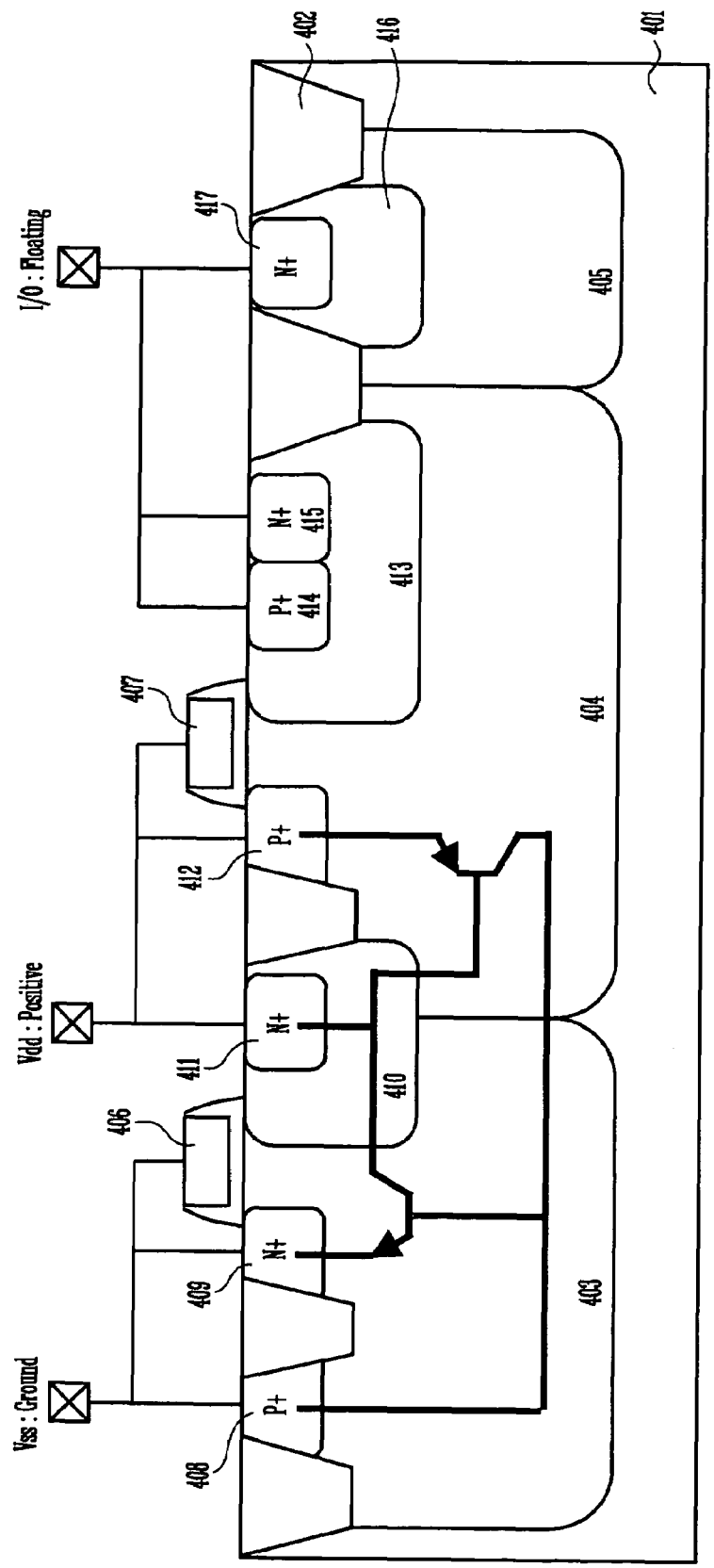

Referring to FIG. 5f, when in the polarity of an ESD stress mode, the ground pad Vss is in a ground state, the power source pad Vdd is a positive voltage and the I/O pad I/O is in a floating state, a SCR in which a lateral NPN BJT and a vertical PNP BJT are interconnected between the power source pad Vdd the ground pad Vss operates to cope with ESD stress. In this time, an avalanche breakdown voltage of each of the lateral NPN BJT and the vertical PNP BJT is determined by a lateral breakdown voltage of each of the drain drift region 410 and the first well 403.

Figure 6A:
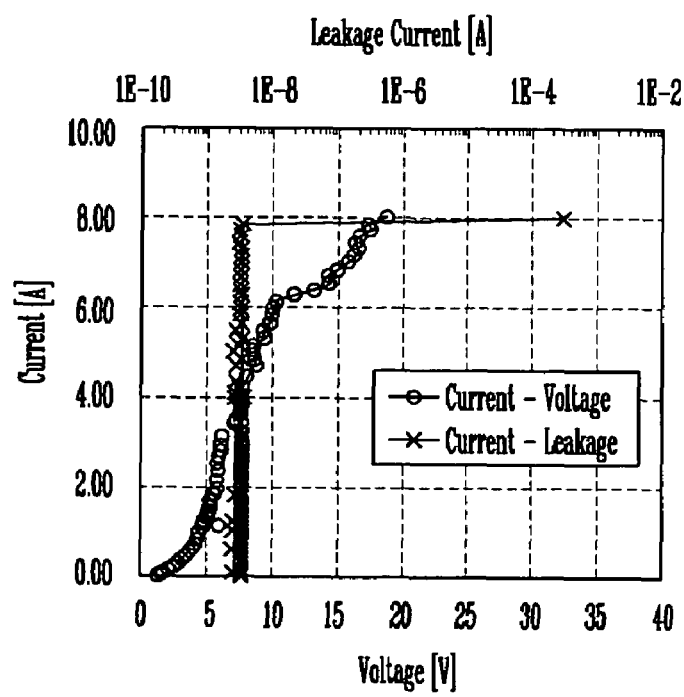
FIGS. 6a to 6c are current-voltage characteristic curves depending on ESD stress modes of the multi-mode ESD device that operates at high voltage according to the present invention.
Figure 6B:
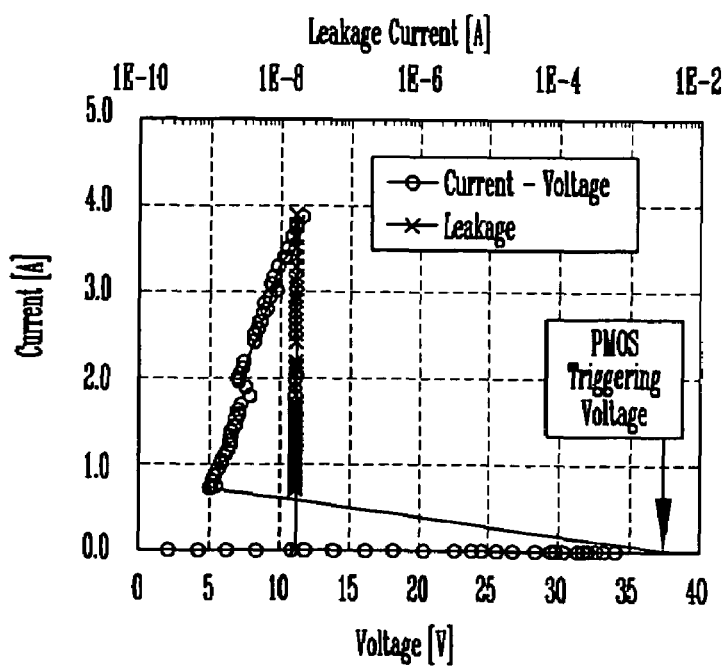
Figure 6C:
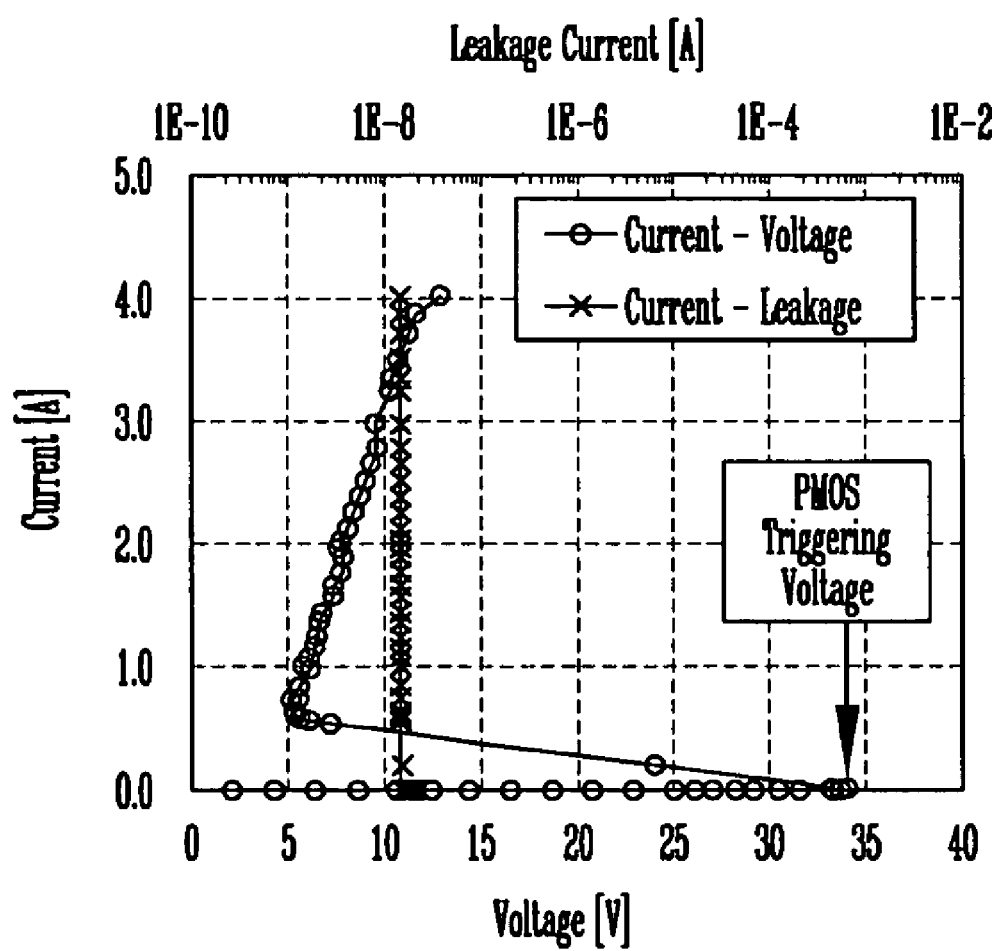

FIGS. 6*a* to 6*c* are current (I)—voltage (V) characteristic curves depending on ESD stress modes of the multi-mode ESD device that operates at high voltage according to the present invention.

FIG. 6*a* shows characteristics of a forward biased diode when the ground pad Vss is a positive voltage, the power source pad Vdd is in a floating state and the I/O pad I/O is in a ground state, when the ground pad Vss is in a floating state, the power source pad Vdd is in a ground state and the I/O pad I/O is a positive voltage, and when the ground pad Vss is a positive voltage, the power source pad Vdd is in a ground state and the I/O pad I/O is in a floating state.

FIG. 6*b* shows characteristics of a SCR an operating voltage of which is the same as an NMOS transistor when the ground pad Vss is in a ground state, the power source pad Vdd is in a floating state and the I/O pad I/O is a positive voltage, and when the ground pad Vss is in a ground state, the power source pad Vdd is a positive voltage and the I/O pad I/O is in a floating state.

FIG. 6*c* shows characteristics of a SCR an operating voltage of which is the same as a PMOS transistor when the ground pad Vss is in a floating state, the power source pad Vdd is a positive voltage and the I/O pad I/O is in a ground state.

Since both the forward biased diode and the SCR have a high current immunity level, if the ESD device according to the present invention is used, it is possible to cope with even ESD stress of a high level while consuming a small layout area for the six ESD stress modes. More particularly, a single ESD protection device can protect against even ESD stress, which is applied between the power source pad Vdd and the ground pad Vss. Furthermore, the triggering voltage of the ESD protection device, which corresponds to each of the ESD stress modes, is the same as the BJT triggering voltage of the NMOS transistor and the PMOS transistor of each of the output buffers in a corresponding ESD stress mode. It is thus possible to efficiently protect the output buffers. It can also be known that the input buffers can be efficiently protected because an ESD stress voltage can be reduced lower than a breakdown voltage of a gate oxide film for ESD stress of all lines.

Figure 7A:
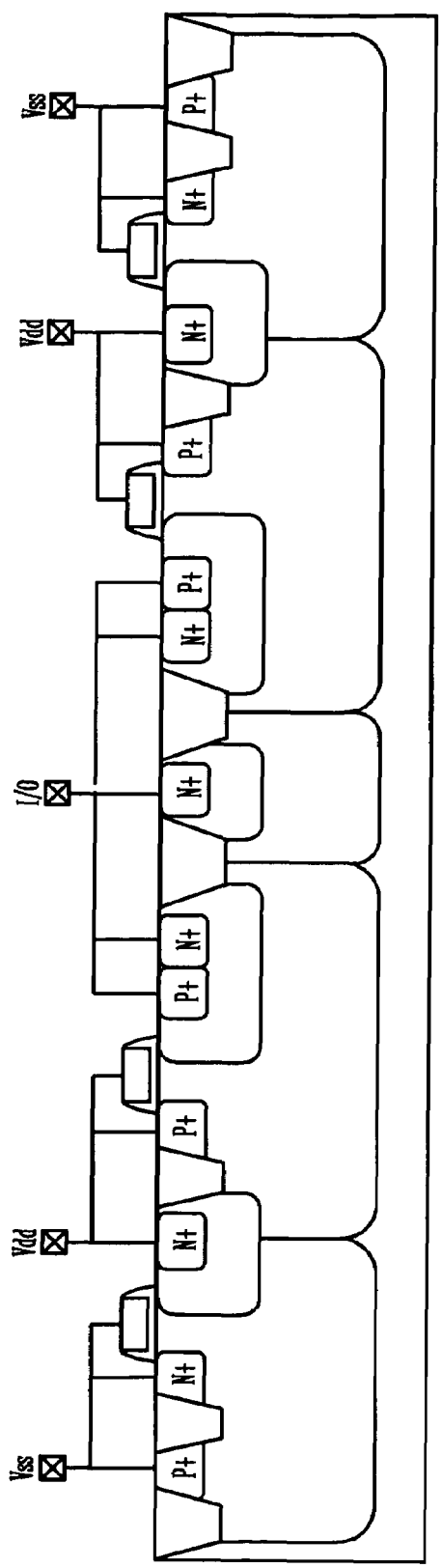
FIGS. 7a and 7b show multi-finger structures of a multi-mode ESD device that operates at high voltage according to the present invention.
Figure 7B:
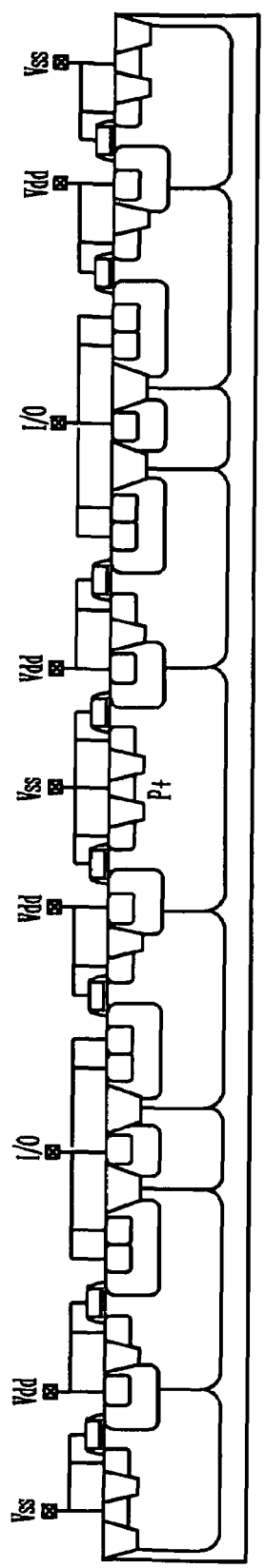

FIGS. 7*a* and 7*b* show multi-finger structures, which have an improved coping capability against ESD stress of a multi-mode ESD device that operates at high voltage according to the present invention. The multi-finger structures are sequentially magnified in a symmetrical shape on the basis of a drain active region connected to an I/O pad I/O and a well pick-up region connected to a ground pad Vss, the multi-finger structures such as 2-finger (FIG. 7*a*), 4-finger (FIG. 7*b*), 6-finger and 8-finger can be obtained.

The aforementioned embodiment of the present invention has dealt with the operational principle and application method thereof in the case where the well pick-up region 408 and the source active region 409 of the DDDNMOS transistor connected to the ground pad, the drain active region 411 of the DDDNMOS transistor connected to the power source pad, and the source active region 412 of the DDDPMOS transistor are separated by the element isolation films 402, and the drain active region 414 and the first active region 415 both of which are connected to the I/O pad, come in contact with each other. It is, however, to be noted that the operational principle and application method thereof proposed in the present invention are not changed depending on whether the drain active region 414 and the first active region 415 are separated or in contact with each other, and whether the element isolation film exists. Accordingly, a method of constructing the drain active region 414 and the first active region 415, which are connected to respective pads, can employ methods proposed in FIGS. 8*a* to 8*f* independently. A method of constructing the well pick-up region 408 and the source active region 409 can employ methods proposed in FIGS. 8*g* to 8*j* independently. A method of constructing the drain active region 411 of the DDDNMOS transistor and the source active region 412 of the DDDPMOS transistor can employ methods proposed in FIGS. 8*j* to 8*l* independently.

Figure 8A:
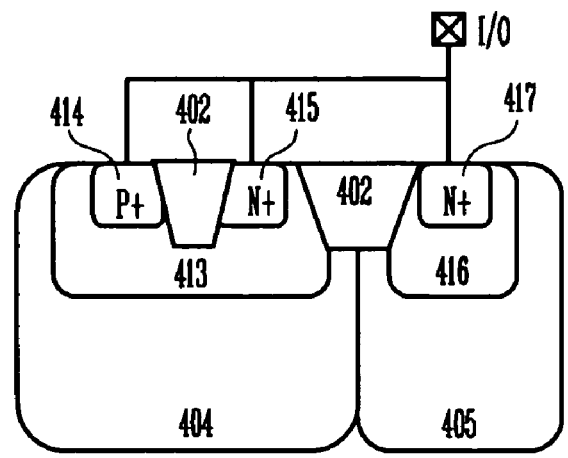
FIGS. 8a to 8m are cross-sectional views showing a multi-mode ESD device that operates at high voltage according to another embodiment of the present invention.

FIG. 8*a* shows an embodiment in which the second well 404 and the third well 405 are separated by the element isolation films 402, and the drain active region 414 and the first active region 415 both of which are formed within the drain drift region 413 of the DDDPMOS transistor are separated by the element isolation films 402.

Figure 8B:
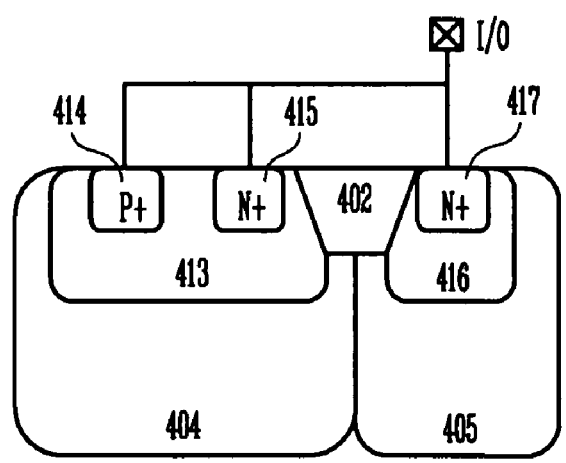

FIG. 8*b* shows an embodiment in which the second well 404 and the third well 405 are separated by the element isolation films 402, and the drain active region 414 and the first active region 415 both of which are formed within the drain drift region 413 of the DDDPMOS transistor are spaced apart by a given distance.

Figure 8C:
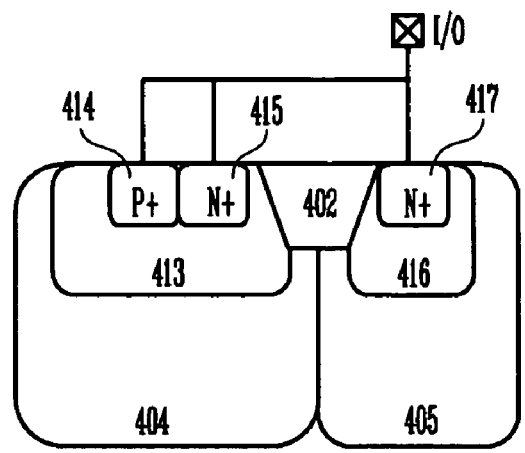

FIG. 8*c* shows an embodiment in which the second well 404 and the third well 405 are separated by the element isolation films 402, and the drain active region 414 and the first active region 415 both of which are formed within the drain drift region 413 of the DDDPMOS transistor are in contact with each other.

Figure 8D:
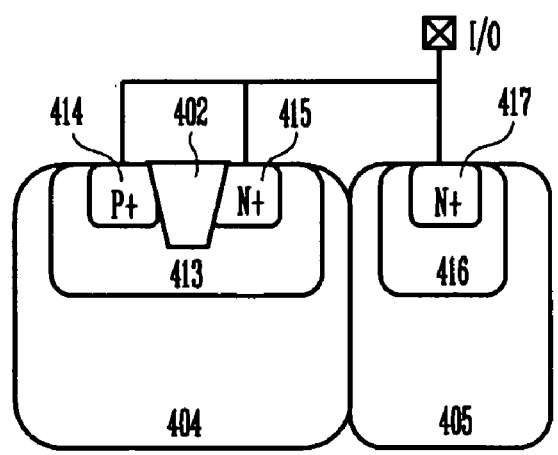

FIG. 8*d* shows an embodiment in which the second well 404 and the third well 405 are in contact with each other, and the drain active region 414 and the first active region 415 both of which are formed within the drain drift region 413 of the DDDPMOS transistor are separated by the element isolation films 402.

Figure 8E:
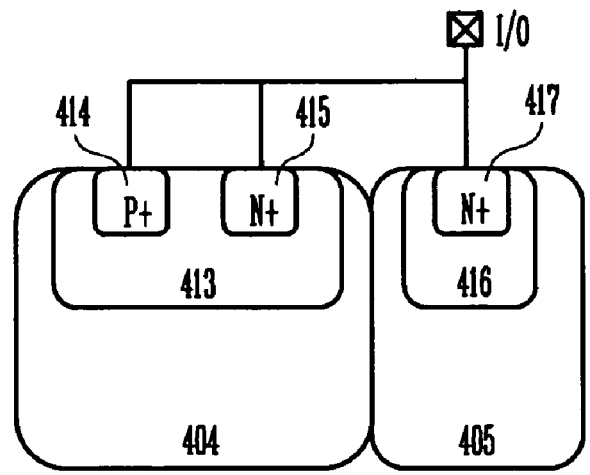

FIG. 8*e* shows an embodiment in which the second well 404 and the third well 405 are in contact with each other, and the drain active region 414 and the first active region 415 both of which are formed within the drain drift region 413 of the DDDPMOS transistor are spaced apart by a given distance.

Figure 8F:
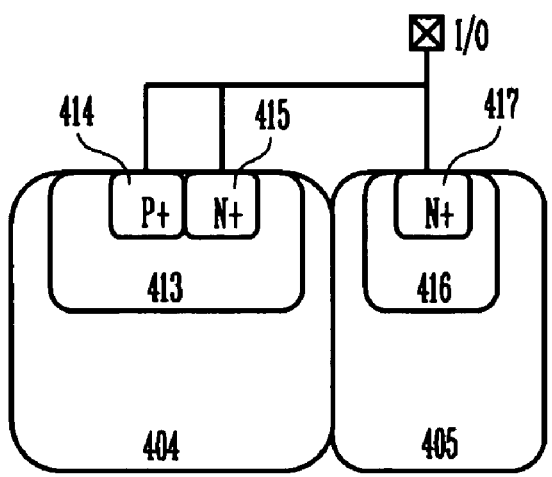

FIG. 8*f* shows an embodiment in which the second well 404 and the third well 405 are in contact with each other, and the drain active region 414 and the first active region 415 both of which are formed within the drain drift region 413 of the DDDPMOS transistor are in contact with each other.

Figure 8G:
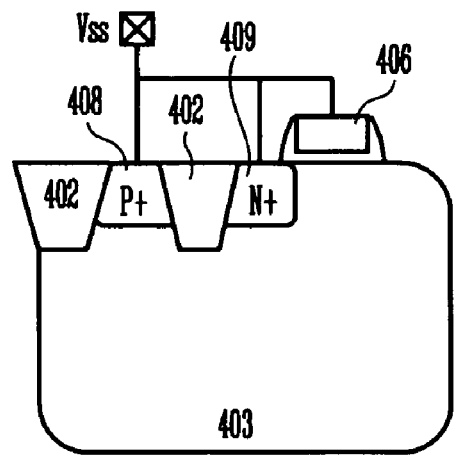

FIG. 8*g* shows an embodiment in which the well pick-up region 408 and the source active region 409 of the DDDNMOS transistor are separated by the element isolation films 402.

Figure 8H:
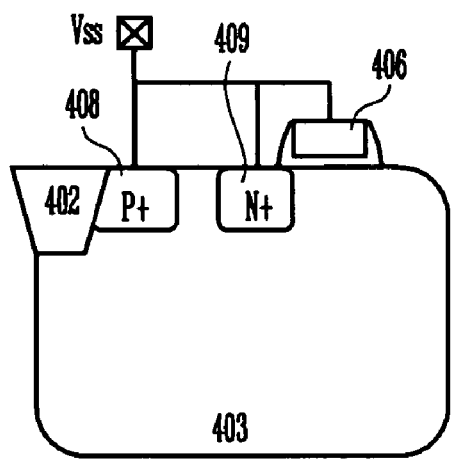

FIG. 8*h* shows an embodiment in which the well pick-up region 408 and the source active region 409 of the DDDNMOS transistor are spaced apart by a given distance.

Figure 8I:
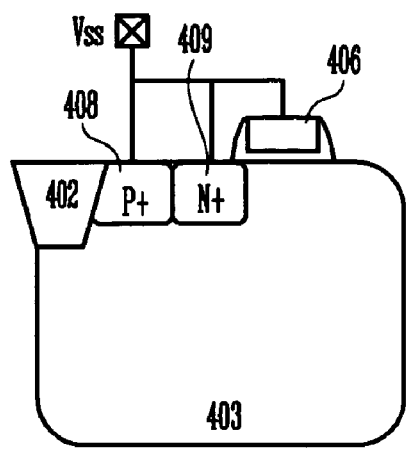

FIG. 8*i* shows an embodiment in which the well pick-up region 408 and the source active region 409 of the DDDNMOS transistor are in contact with each other.

Figure 8J:
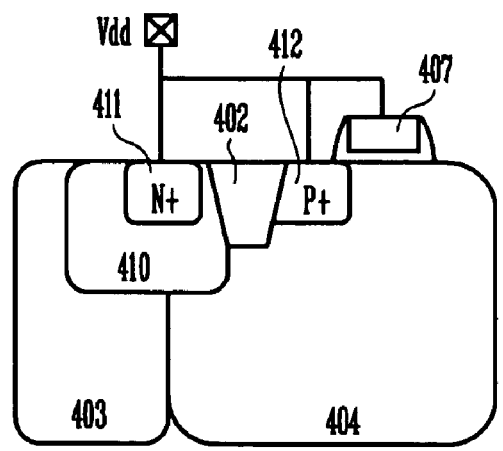

FIG. 8*j* shows an embodiment in which the drain drift region 410 and the drain active region 411 of the DDDNMOS transistor are separated from the source active region 412 of the DDDPMOS transistor by means of the element isolation films 402.

Figure 8K:
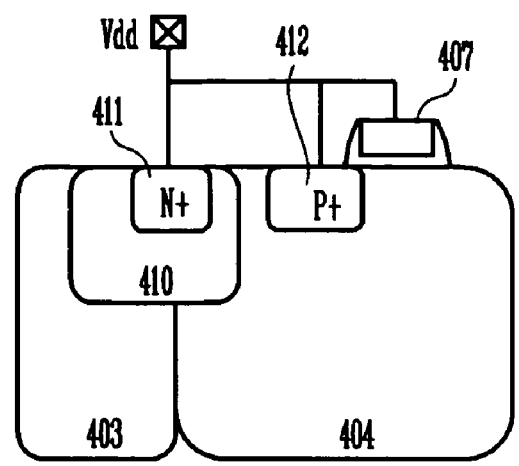

FIG. 8*k* shows an embodiment in which the drain drift region 410 and the drain active region 411 of the DDDNMOS transistor are spaced apart from the source active region 412 of the DDDPMOS transistor by a given distance.

Figure 8L:
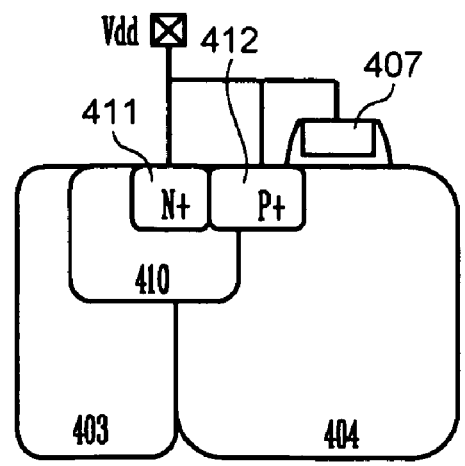

FIG. 8*l* shows an embodiment in which the drain active region 411 of the DDDNMOS transistor is in contact with the source active region 412 of the DDDPMOS transistor.

Figure 8M:
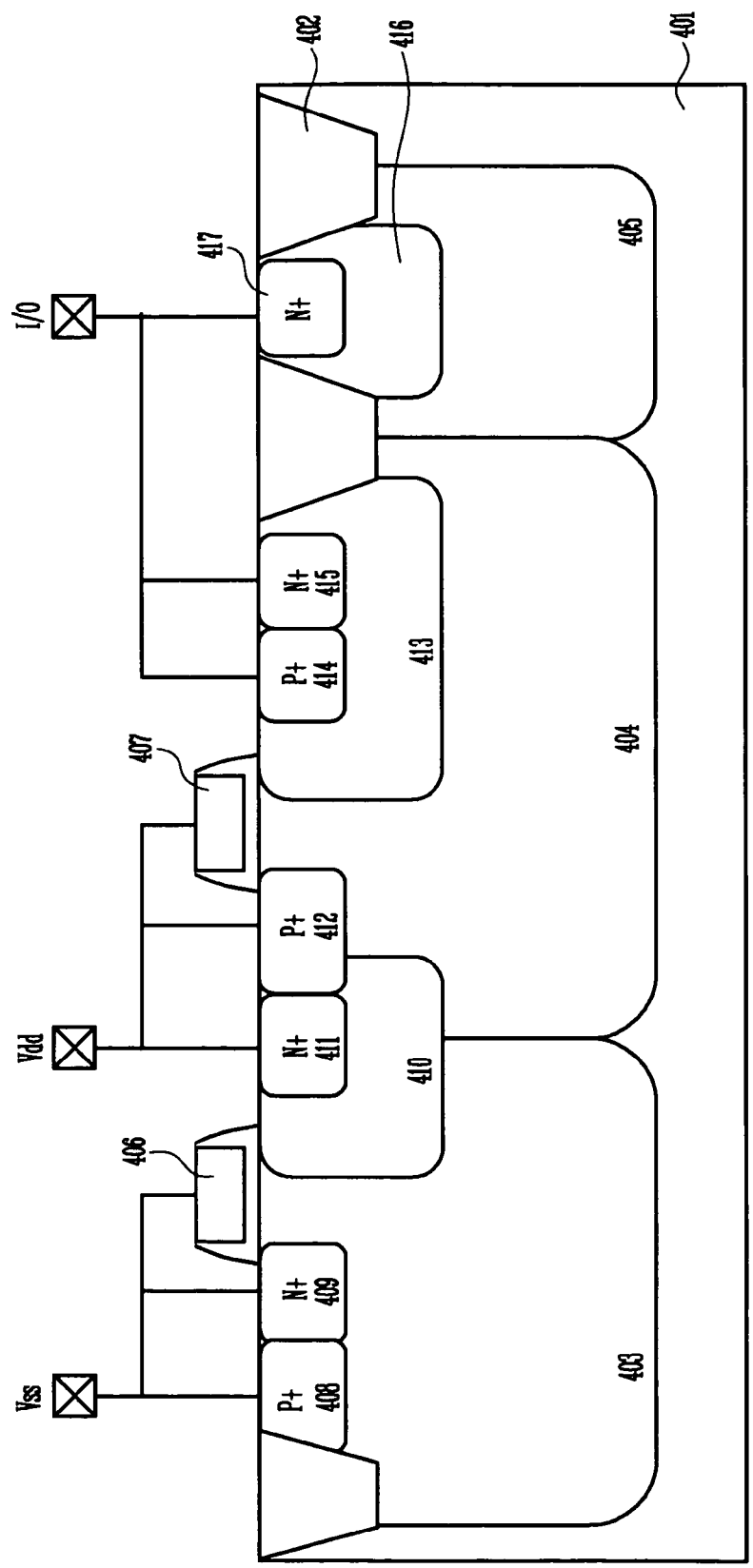

FIG. 8*m* shows a case where the multi-mode ESD device is constructed by employing the embodiment shown in FIG. 8*c* as a connection mode of the I/O pad I/O, the embodiment shown in FIG. 8*i* as a connection mode of the ground pad Vss, and the embodiment shown in FIG. 8*l* as a connection mode of the power source pad Vdd.

Furthermore, in the above-described embodiment, the operational principle and application method thereof have been described by taking the structure in which the source region 409 of the DDDNMOS transistor and the source region 412 of the DDDPMOS transistor are not respectively formed in the drift region, i.e., a uni-structure as an example. It is, however, to be noted that the operational principle and application method thereof proposed in the present invention can be true of the structure in which the source active region 409 of the DDDNMOS transistor is formed within a low-concentration N-type drift region 420, as shown in FIGS. 9*a* to 9*c*, or the structure in which the source active region 412 of the DDDPMOS transistor is formed within a low concentration P-type drift region 421, as shown in FIGS. 9*d* to 9*f*.

Figure 9A:
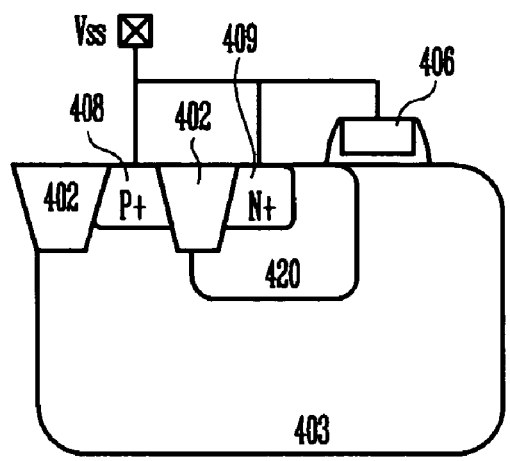
FIGS. 9a to 9g are cross-sectional views showing a multi-mode ESD device that operates at high voltage according to still another embodiment of the present invention.

FIG. 9*a* shows an embodiment in which the source active region 409 of the DDDNMOS transistor is formed within the drift region 420, and the well pick-up region 408 and the source active region 409 within the drift region 420 are separated by the element isolation films 402.

Figure 9B:
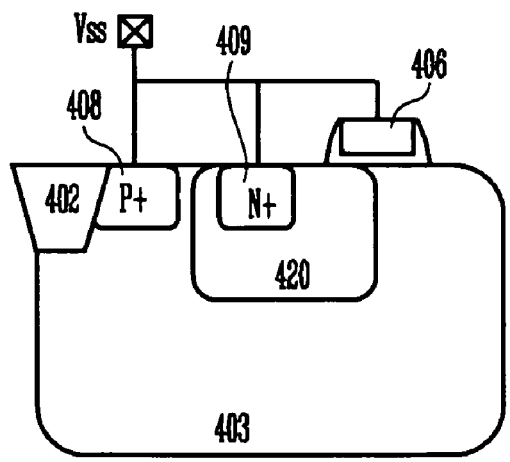

FIG. 9*b* shows an embodiment in which the source active region 409 of the DDDNMOS transistor is formed within the drift region 420, and the well pick-up region 408 and the source active region 409 within the drift region 420 are spaced apart by a given distance.

Figure 9C:
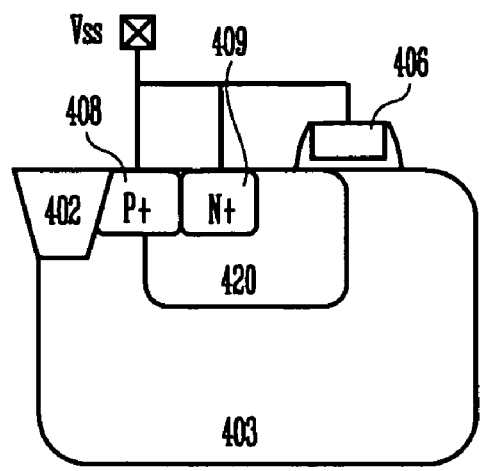
Figure 9D:
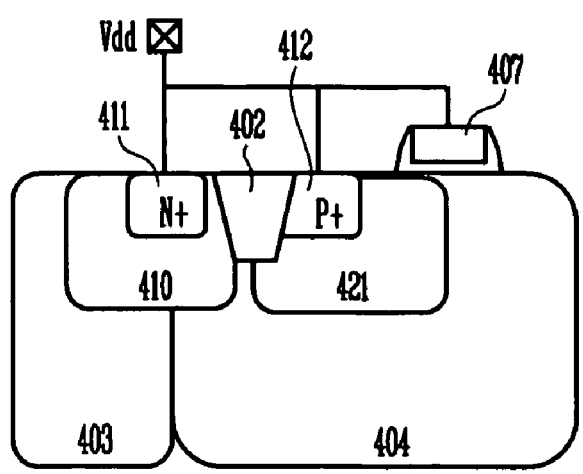
Figure 9E:
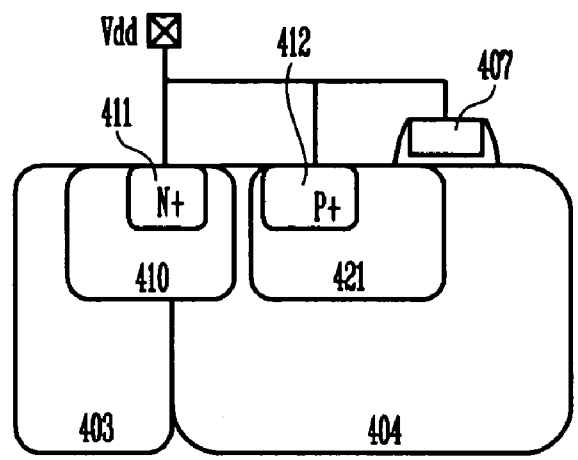
Figure 9F:
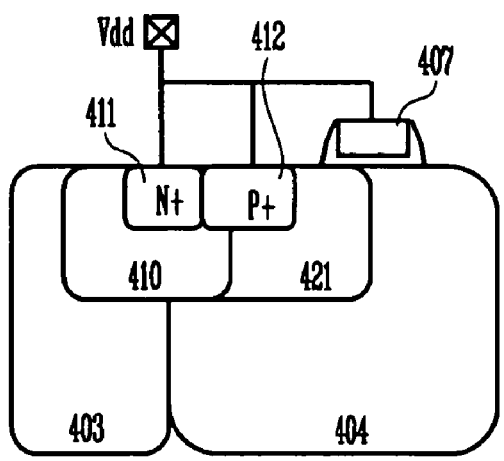

FIG. 9*c* shows an embodiment in which the source active region 409 of the DDDNMOS transistor is formed within the drift region 420, and the well pick-up region 408 is in contact with the source active region 409.

FIG. 9*d* shows an embodiment in which the source active region 412 of the DDDPMOS transistor is formed within the drift region 421, and the drift region 410 of the DDDNMOS transistor and the drift region 421 of the DDDPMOS transistor are separated by the element isolation films 402.

FIG. 9*e* shows an embodiment in which the source active region 412 of the DDDPMOS transistor is formed within the drift region 421, and the drift region 410 of the DDDNMOS transistor and the drift region 421 of the DDDPMOS transistor are spaced apart by a given distance.

FIG. 9*f* shows an embodiment in which the source active region 412 of the DDDPMOS transistor is formed within the drift region 421, and the drift region 410 of the DDDNMOS transistor and the drift region 421 of the DDDPMOS transistor are in contact with each other, whereby the drain active region 411 of the DDDNMOS transistor and the source active region 412 of the DDDPMOS transistor are in contact with each other.

Figure 9G:
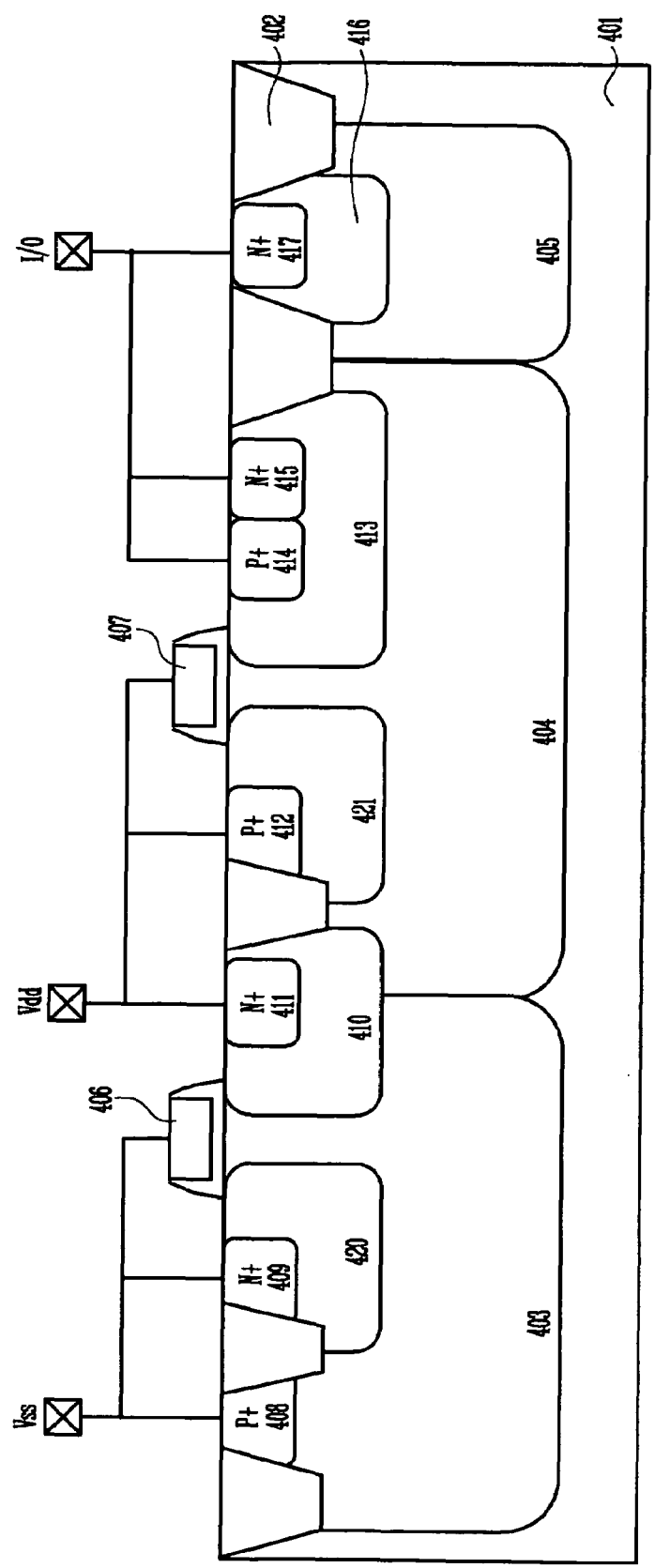

FIG. 9*g* shows a case where a multi-mode ESD device is constructed by employing the method shown in FIG. 9*a* as a connection method of the ground pad Vss and the method shown in FIG. 9*d* as a connection method of the power source pad Vdd.

Meanwhile, in the present embodiment of the present invention, the operational principle and application method thereof of, more particularly, the structure in which the drain region is spaced apart from the end of the gate, i.e., an expended drain MOS transistor structure in the DDDMOS transistor have been described. It is, however, to be noted that the operational principle and application method thereof proposed as an embodiment of the present invention can be true of all structures of a DDDMOS transistor. For example, the operational principle and application method thereof can be true of a structure in which the drain region is in contact with the end of the gate, as shown in FIG. 10*a*, and a structure in which an element isolation film is inserted into the bottom of the gate, as shown in FIG. 10*b*, in the DDDMOS transistor structure.

Figure 10A:
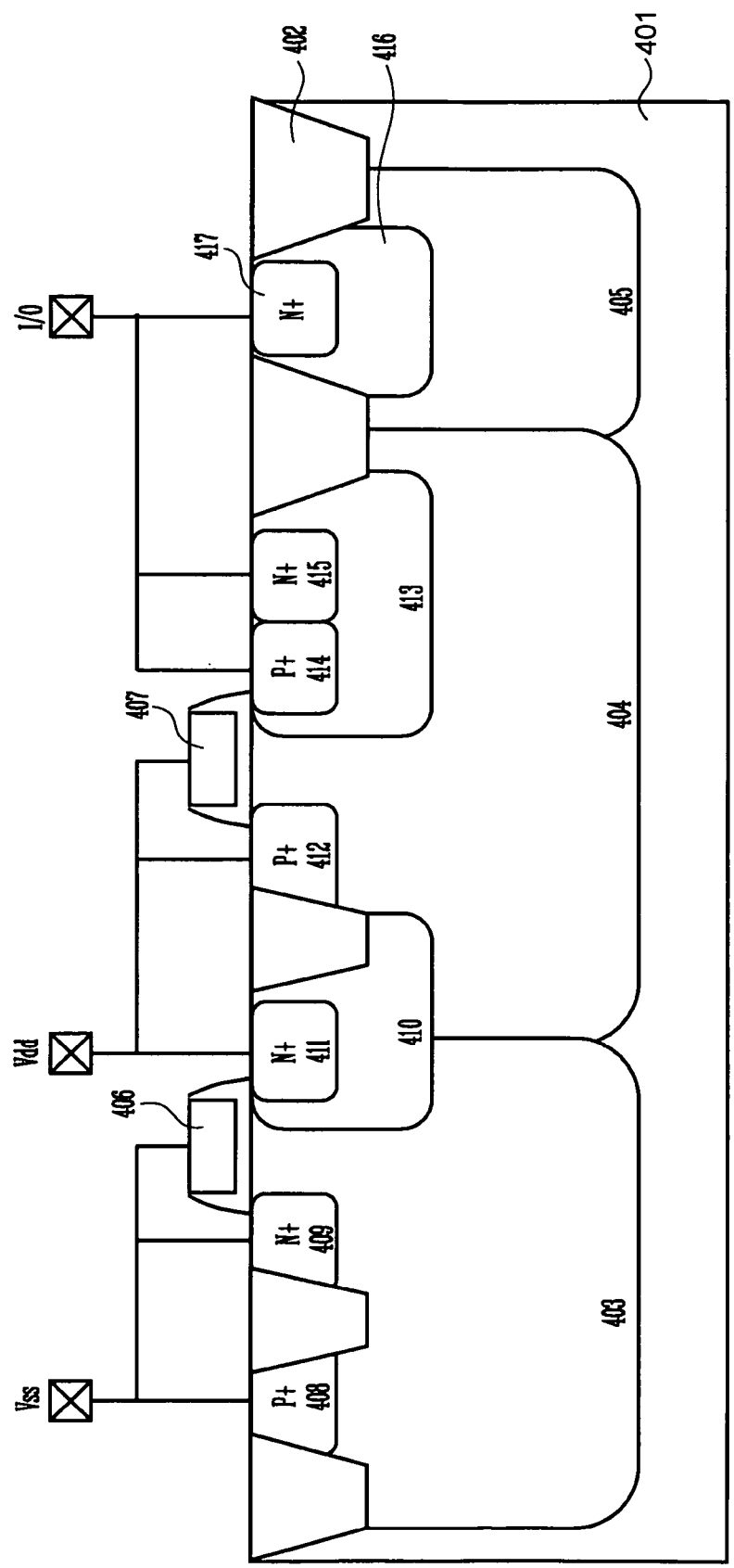
FIGS. 10a and 10b are cross-sectional views showing a multi-mode ESD device that operates at high voltage according to still another embodiment of the present invention.

FIG. 10*a* shows a multi-mode ESD device in which the drain active regions 411 and 414 of the DDDNMOS transistor and the DDDPMOS transistor are in contact with the end of the gates 406 and 407.

Figure 10B:
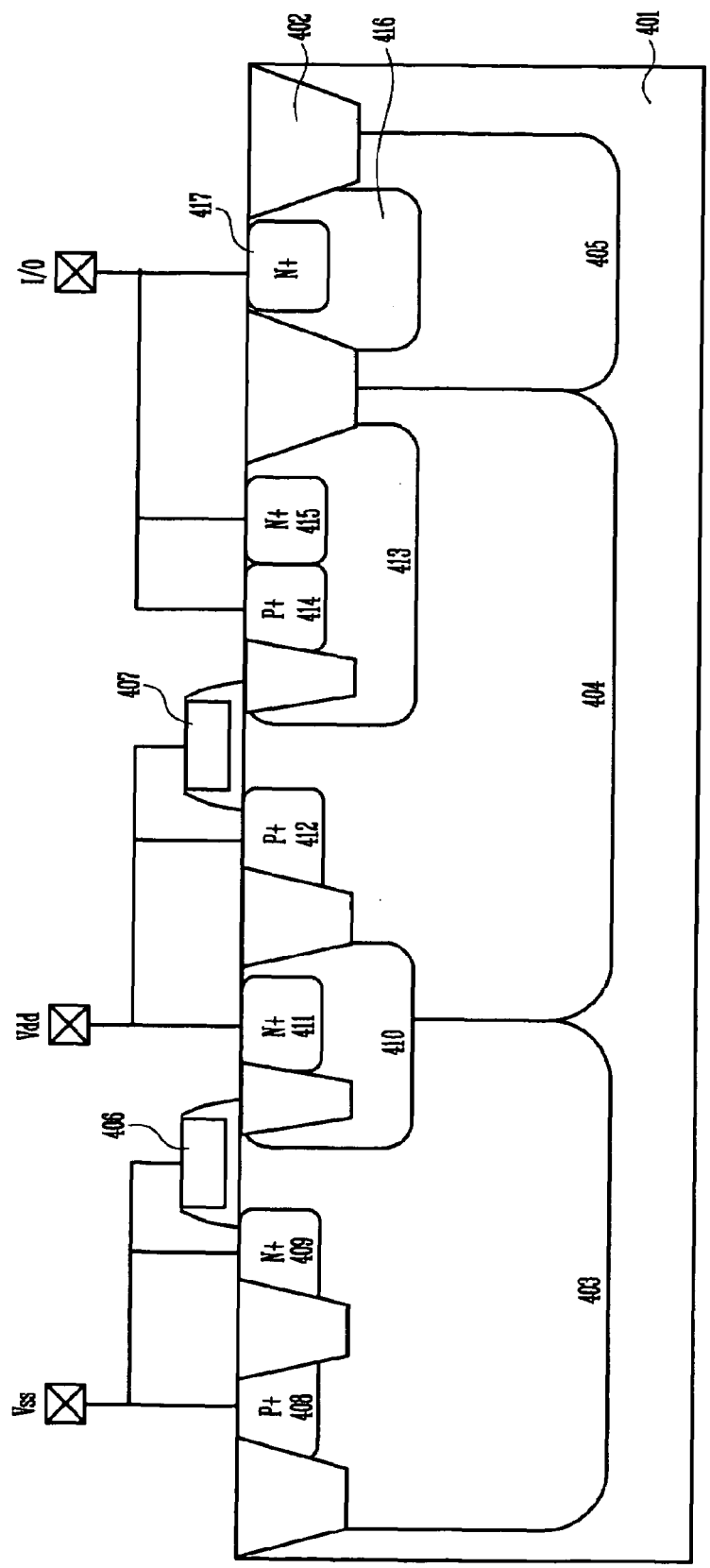

FIG. 10*b* shows a multi-mode ESD device in which the element isolation films 402 are formed within the drain drift regions 410 and 413 under the gates 406 and 407 of the DDDNMOS transistor and the DDDPMOS transistor.

As described above, according to the present invention, if a multi-mode ESD device is constructed by employing a DDDNMOS transistor and a DDDPMOS transistor that operate at high voltage, the following effects can be obtained.

(1) A single ESD protection device can cope with ESD stress of six modes, which can occur in each of I/O cells. Accordingly, a layout area necessary for ESD protection can be reduced.

(2) A single ESD protection device can protect against even ESD stress applied to a power source pad and a ground pad. Accordingly, a possibility that, if a power clamp is not properly disposed, ESD stress applied between the power source pad and the ground pad is introduced into a core circuit, thus causing a problem in the core circuit can be prevented fundamentally.

(3) Regarding ESD protection o the six modes, the DDDNMOS transistor and the DDDPMOS transistor proposed in the present invention, which operate at high voltage, operates in the form of a forward biased diode and a SCR device. Both the forward biased diode and the SCR represent a high current immunity level. Accordingly, by employing the device proposed in the present invention, it is possible to cope with a high level of ESD stress, while using a small layout area for disposing ESD protection devices.

(4) A triggering voltage of the ESD protection device proposed in the present invention is the same as a BJT triggering voltage of an NMOS transistor and a PMOS transistor of each of output buffers in a corresponding ESD stress mode. It is thus possible to efficiently protect the output buffers.

(5) Regarding ESD stress of all nodes, an ESD stress voltage can be reduced lower than a breakdown voltage of a gate oxide film. It is also possible to efficiently protect input buffers.

(6) A core circuit, an output buffer and an input buffer can be protected efficiently against pin-to-pin mode ESD stress in which ESD stress is applied between an I/O cell and an I/O cell. That is, ESD stress current is smoothly bypassed between the I/O cell and the I/O cell along a forward diode path that operates against three ESD stress modes. Therefore, a danger that the core circuit, the output buffer and the input buffer will be damaged is lowered.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A circuit for electrostatic discharge protection, comprising:
   an input buffer, which is connected between a power source pad and a ground pad and has one terminal connected to an I/O pad; and
   a device for electrostatic discharge protection, which is connected between the power source pad, the ground pad and the I/O pad.

2. The circuit as claimed in claim 1, wherein the device for electrostatic discharge protection comprises:
   first to third wells formed on a semiconductor substrate;
   a first device, which includes a well pick-up region, a source region and a double diffused drain region, which are formed in predetermined regions on the first well, and a gate formed in a predetermined region on the semiconductor substrate;
   a second device, which includes a source region, a double diffused drain region and a first active region, which are formed in predetermined regions on the second well, and a gate formed in a predetermined region on the semiconductor substrate; and
   a second active region formed on the third well,
   wherein the gate, the source region and the well pick-up region of the first device are connected to a ground pad; the drain of the first device, and the source and the gate of the second device are connected to a power source pad; and the drain and the first active region of the second device, and the second active region are connecter to an I/O pad.

3. A circuit for electrostatic discharge protection, comprising:
   an output buffer, which is connected between a power source pad and a ground pad and has one terminal connected to an I/O pad; and
   a device for electrostatic discharge protection, which is connected between the power source pad, the ground pad and the I/O pad.

4. The circuit as claimed in claim 3, wherein the device for electrostatic discharge protection comprises:
   first to third wells formed on a semiconductor substrate;
   a first device, which includes a well pick-up region, a source region and a double diffused drain region, which are formed in predetermined regions on the first well, and a gate formed in a predetermined region on the semiconductor substrate;
   a second device, which includes a source region, a double diffused drain region and a first active region, which are formed in predetermined regions on the second well, and a gate formed in a predetermined region on the semiconductor substrate; and
   a second active region formed on the third well,
   wherein the gate, the source region and the well pick-up region of the first device are connected to a ground pad; the drain of the first device, and the source and the gate of the second device are connected to a power source pad; and the drain and the first active region of the second device, and the second active region are connecter to an I/O pad.

5. A circuit for electrostatic discharge protection, comprising:
   an input buffer, which is connected between a power source pad and a ground pad and has one terminal connected to an I/O pad;
   an output buffer, which is connected between a power source pad and a ground pad and has one terminal connected to an I/O pad; and
   a device for electrostatic discharge protection, which is connected between the power source pad, the ground pad and the I/O pad.

6. The circuit as claimed in claim 5, wherein the device for electrostatic discharge protection comprises:
   first to third wells formed on a semiconductor substrate;
   a first device, which includes a well pick-up region, a source region and a double diffused drain region, which are formed in predetermined regions on the first well, and a gate formed in a predetermined region on the semiconductor substrate;
   a second device, which includes a source region, a double diffused drain region and a first active region, which are formed in predetermined regions on the second well, and a gate formed in a predetermined region on the semiconductor substrate; and
   a second active region formed on the third well,
   wherein the gate, the source region and the well pick-up region of the first device are connected to a ground pad; the drain of the first device, and the source and the gate of the second device are connected to a power source pad; and the drain and the first active region of the second device, and the second active region are connecter to an I/O pad.

* * * * *

UNITED STATES PATENT AND TRADEMARK OFFICE
CERTIFICATE OF CORRECTION

PATENT NO. : 7,385,253 B2  Page 1 of 1
APPLICATION NO. : 11/051858
DATED : June 10, 2008
INVENTOR(S) : Kil H. Kim It is certified that error appears in the above-identified patent and that said Letters Patent is hereby corrected as shown below:

<u>In the Claims:</u>

At Column 13, lines 29-30, "connecter" should be -- connected --.

At Column 14, lines 45-46, "connecter" should be -- connected --.

Signed and Sealed this

Twenty-sixth Day of May, 2009

JOHN DOLL
*Acting Director of the United States Patent and Trademark Office*